(12) United States Patent
Lin et al.

(10) Patent No.: US 12,426,334 B2
(45) Date of Patent: Sep. 23, 2025

(54) FinFET DEVICE AND METHOD

(71) Applicant: Taiwan Semiconductor Manufacturing Co., Ltd., Hsinchu (TW)

(72) Inventors: Chih-Han Lin, Hsinchu (TW); Ming-Ching Chang, Hsinchu (TW); Chao-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/655,832

(22) Filed: May 6, 2024

(65) Prior Publication Data
US 2024/0290867 A1    Aug. 29, 2024

Related U.S. Application Data

(60) Continuation of application No. 17/345,188, filed on Jun. 11, 2021, now Pat. No. 12,009,406, which is a
(Continued)

(51) Int. Cl.
| | |
|---|---|
| *H10D 64/01* | (2025.01) |
| *H10D 30/01* | (2025.01) |
| *H10D 30/62* | (2025.01) |
| *H10D 30/69* | (2025.01) |
| *H10D 62/00* | (2025.01) |

(Continued)

(52) U.S. Cl.
CPC ......... *H10D 64/017* (2025.01); *H10D 30/024* (2025.01); *H10D 30/6211* (2025.01); *H10D 30/6219* (2025.01); *H10D 30/797* (2025.01); *H10D 62/021* (2025.01); *H10D 62/116* (2025.01); *H10D 62/151* (2025.01); *H10D 64/516* (2025.01); *H10D 84/013* (2025.01); *H10D 84/0135* (2025.01); *H10D 84/0144* (2025.01); *H10D 84/0158* (2025.01); *H10D 84/038* (2025.01)

(58) Field of Classification Search
CPC .......... H01L 29/66545; H01L 29/0653; H01L 29/0847; H01L 29/41791; H01L 29/42368; H01L 29/66636; H01L 29/66795; H01L 29/7848; H01L 29/7851; H01L 21/823418; H01L 21/823431; H01L 21/823437; H01L 21/823462; H10D 64/017; H10D 30/6211; H10D 62/116; H10D 84/013; H10D 84/0135; H10D 62/021; H10D 84/0158; H10D 84/0144; H10D 30/024; H10D 62/151; H10D 30/797

See application file for complete search history.

(56) References Cited

U.S. PATENT DOCUMENTS

| | | |
|---|---|---|
| 10,811,320 B2 | 10/2020 | Huang et al. |
| 2014/0239393 A1* | 8/2014 | Kuo ............... H01L 29/6653 438/424 |

(Continued)

*Primary Examiner* — Christine A Enad
(74) *Attorney, Agent, or Firm* — Slater Matsil, LLP

(57) ABSTRACT

A semiconductor device includes a fin extending from a substrate, a gate stack over and along a sidewall of the fin, a spacer along a first sidewall of the gate stack and the sidewall of the fin, a dummy gate material along the sidewall of the fin, wherein the dummy gate material is between the spacer and the gate stack, and a first epitaxial source/drain region in the fin and adjacent the gate stack.

20 Claims, 26 Drawing Sheets

Related U.S. Application Data division of application No. 16/549,046, filed on Aug. 23, 2019, now Pat. No. 11,043,576.

(51) Int. Cl.
*H10D 62/10* (2025.01)
*H10D 62/13* (2025.01)
*H10D 64/27* (2025.01)
*H10D 84/01* (2025.01)
*H10D 84/03* (2025.01)

(56) References Cited

U.S. PATENT DOCUMENTS

| | | |
|---|---|---|
| 2016/0111543 A1 | 4/2016 | Fang et al. |
| 2016/0190280 A1 | 6/2016 | Young et al. |
| 2017/0162668 A1 | 6/2017 | Kim et al. |
| 2017/0316984 A1 | 11/2017 | Lin et al. |
| 2018/0069101 A1 | 3/2018 | Chang et al. |
| 2020/0098890 A1 | 3/2020 | Wu et al. |
| 2020/0403082 A1* | 12/2020 | Chuang ............ H01L 29/66795 |

* cited by examiner

FinFET DEVICE AND METHOD

PRIORITY CLAIM AND CROSS-REFERENCE

This application is a continuation of U.S. patent application Ser. No. 17/345,188, filed on Jun. 11, 2021, now U.S. Pat. No. 12,009,406, issued Jun. 11, 2024, which is a divisional of U.S. patent application Ser. No. 16/549,046, filed on Aug. 23, 2019, now U.S. Pat. No. 11,043,576, issued Jun. 22, 2021, each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
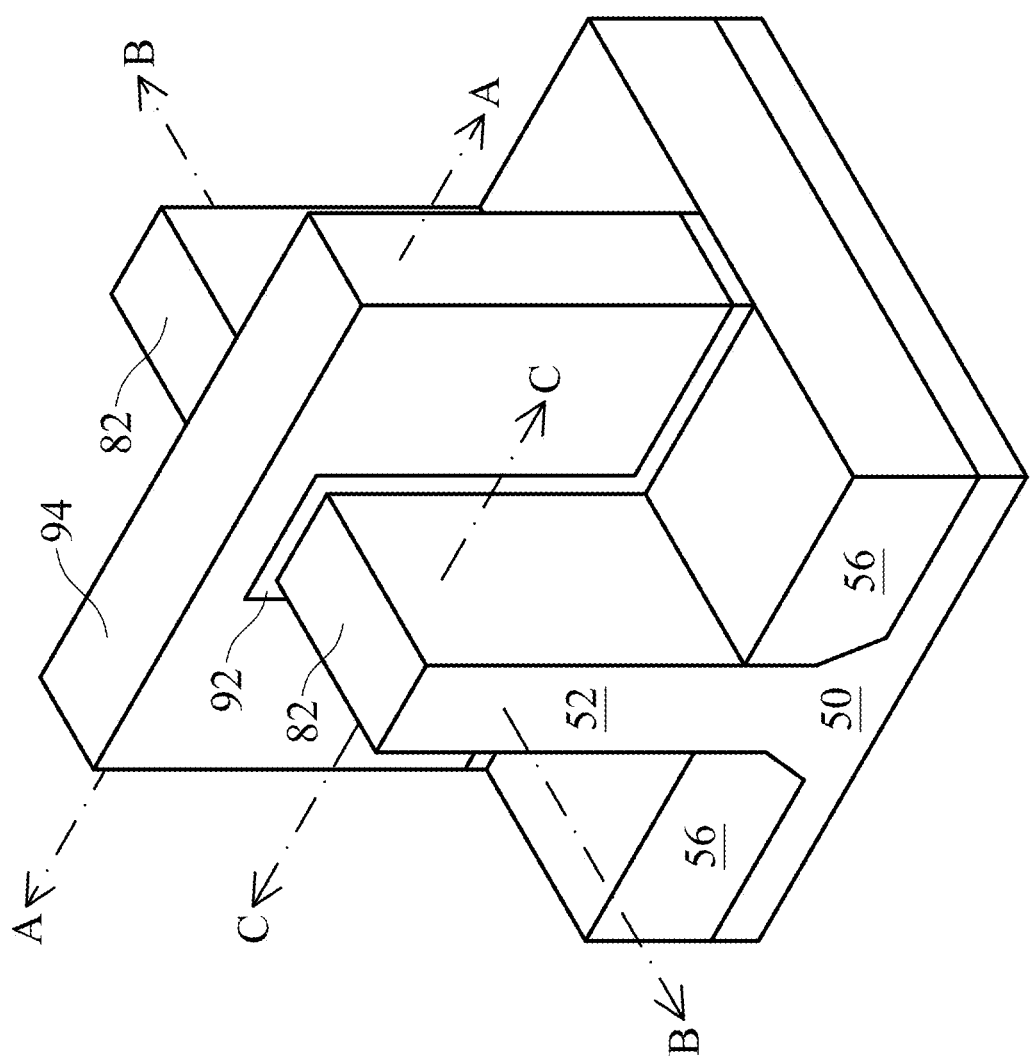
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments describe processes for forming a FinFET having a replacement gate stack with rounded or chamfered edges. In some embodiments, the etching process that removes the dummy gate stack is configured such that the dummy gate stack is removed except portions in corner regions of the dummy gate stack. The remaining portions of the dummy gate stack block the replacement gate stack from being formed in the corner regions, and cause the replacement gate stack to be formed with rounded or chamfered edges at the remaining portions of the dummy gate stack. The presence of the remaining portions of the dummy gate stack cause the distance from the epitaxial source/drain regions to the replacement gate stack to be larger, as the replacement gate stack is not formed in the formed in the corner regions. The increased distance between the epitaxial source/drain regions and the replacement gate stack can reduce leakage current between the epitaxial source/drain regions and the replacement gate stack, and thus improve performance in a FinFET device. Additionally, the increased distance reduces the chance of conductive residue formed during processing causing a short between the epitaxial source/drain regions and the replacement gate stack. Thus, the formation of a rounded or chamfered replacement gate stack can increase the window of process conditions available, improve yield, and improve device performance.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 16B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, and 16A are illustrated along reference cross-section A-A illustrated in FIG. 1, and FIGS. 8B, 9B, 10B, 11B, 12B, 13B, 14B, 14E, 15B, and 16B are illustrated along a similar cross-section B-B illustrated in FIG. 1, except for multiple fins/FinFETs. FIGS. 10D and 10E are illustrated along reference cross-section C-C illustrated in FIG. 1, except for multiple fins/FinFETs. FIGS. 8C, 9C, 10C, 12C, 13C, and 14C are illustrated in a plan view.

Figure 2:
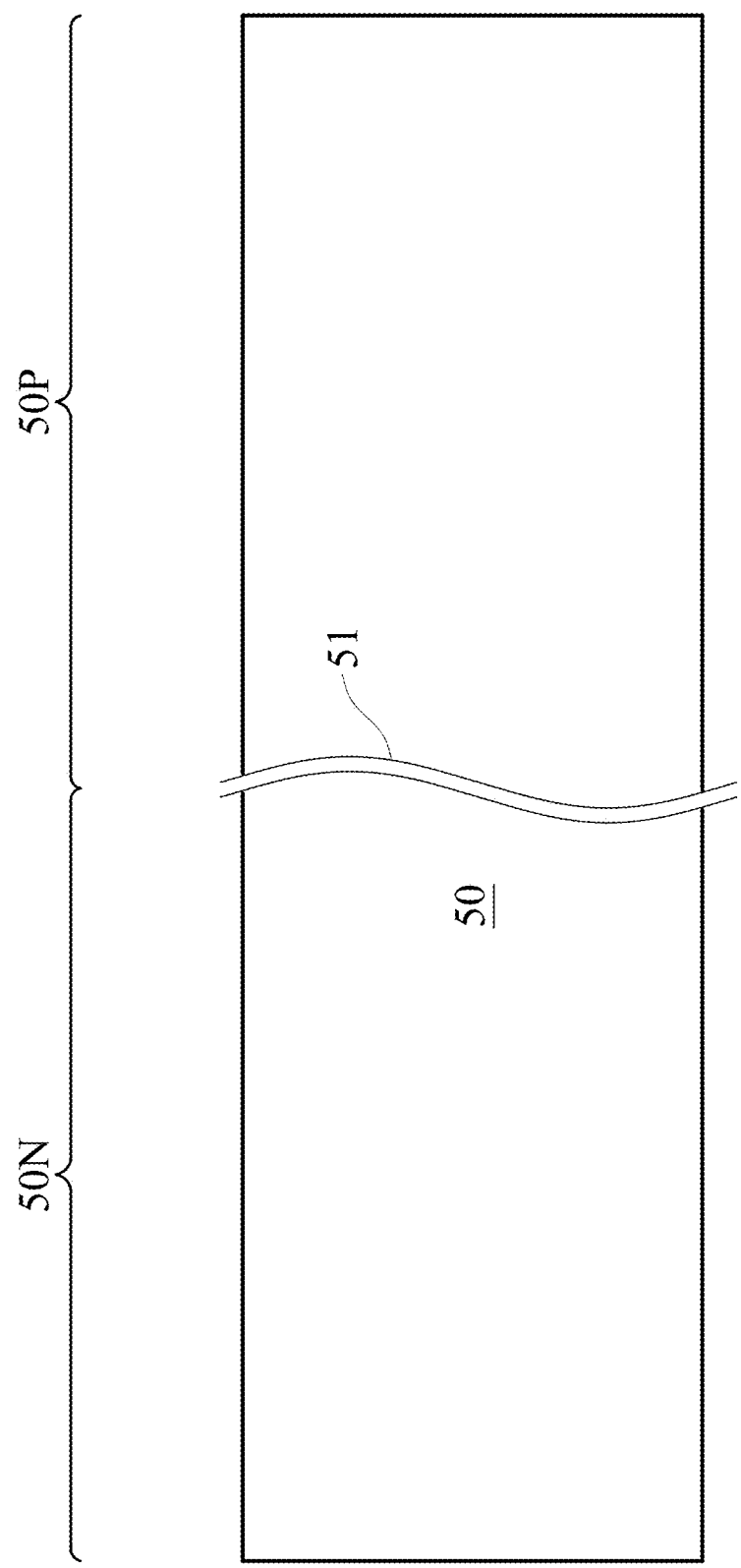
FIGS. 2, 3, 4, 5, 6, 7, 8A, 8B, 8C, 9A, 9B, 9C, 10A, 10B, 10C, 10D, 10E, 11A, 11B, 12A, 12B, 12C, 13A, 13B, 13C, 13D, 14A, 14B, 14C, 14D, 14E, 15A, 15B, 16A, and 16B are cross-sectional views or plan views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
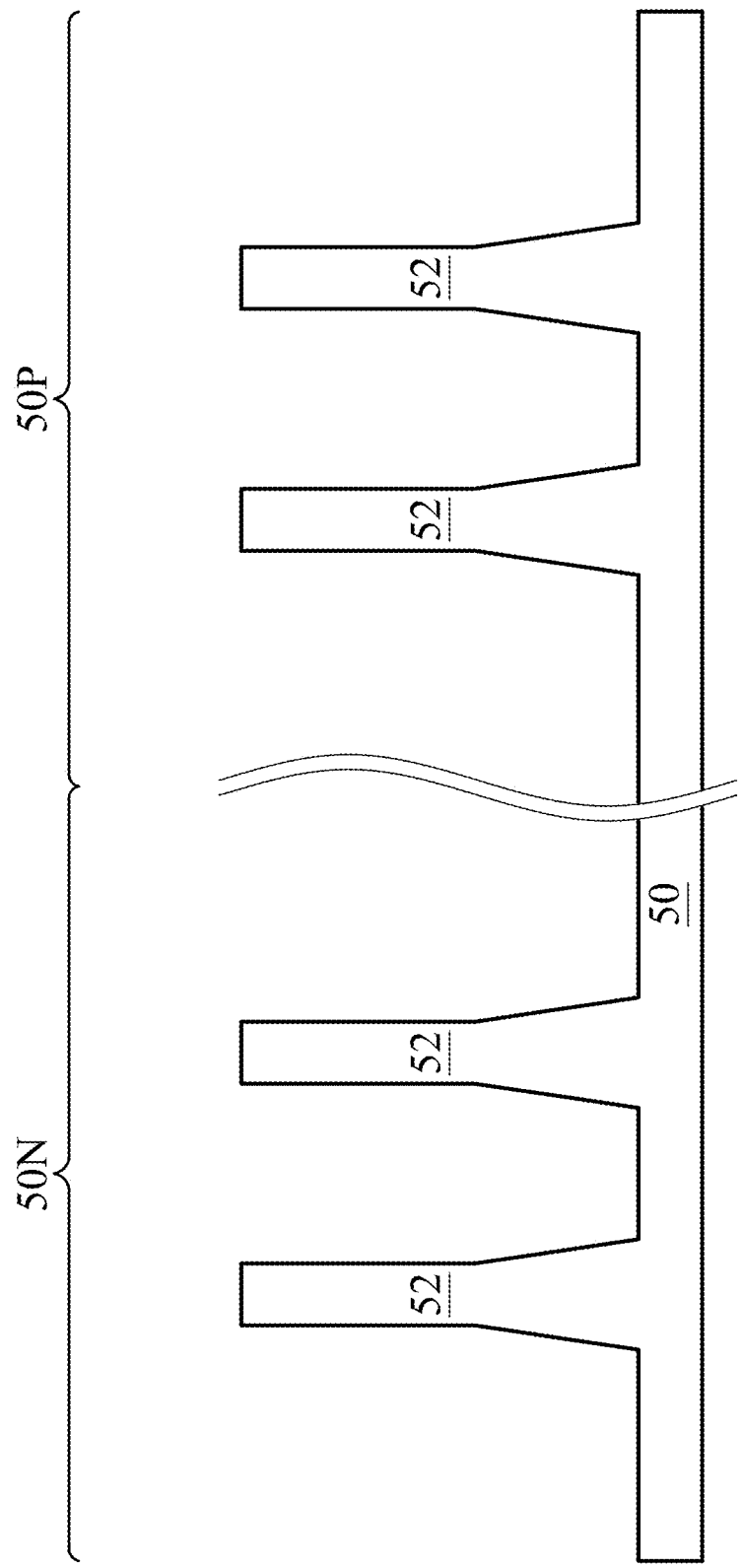

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
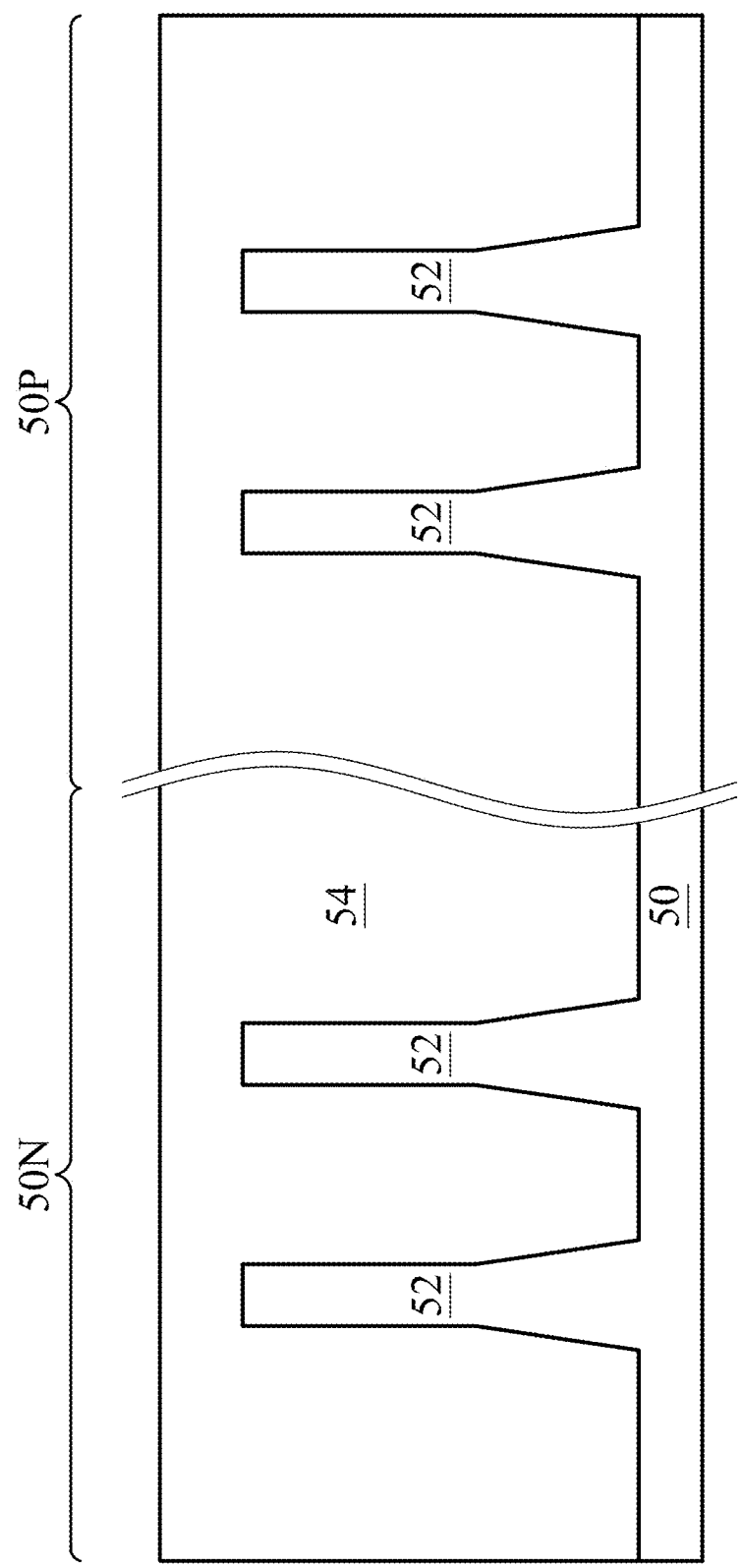

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
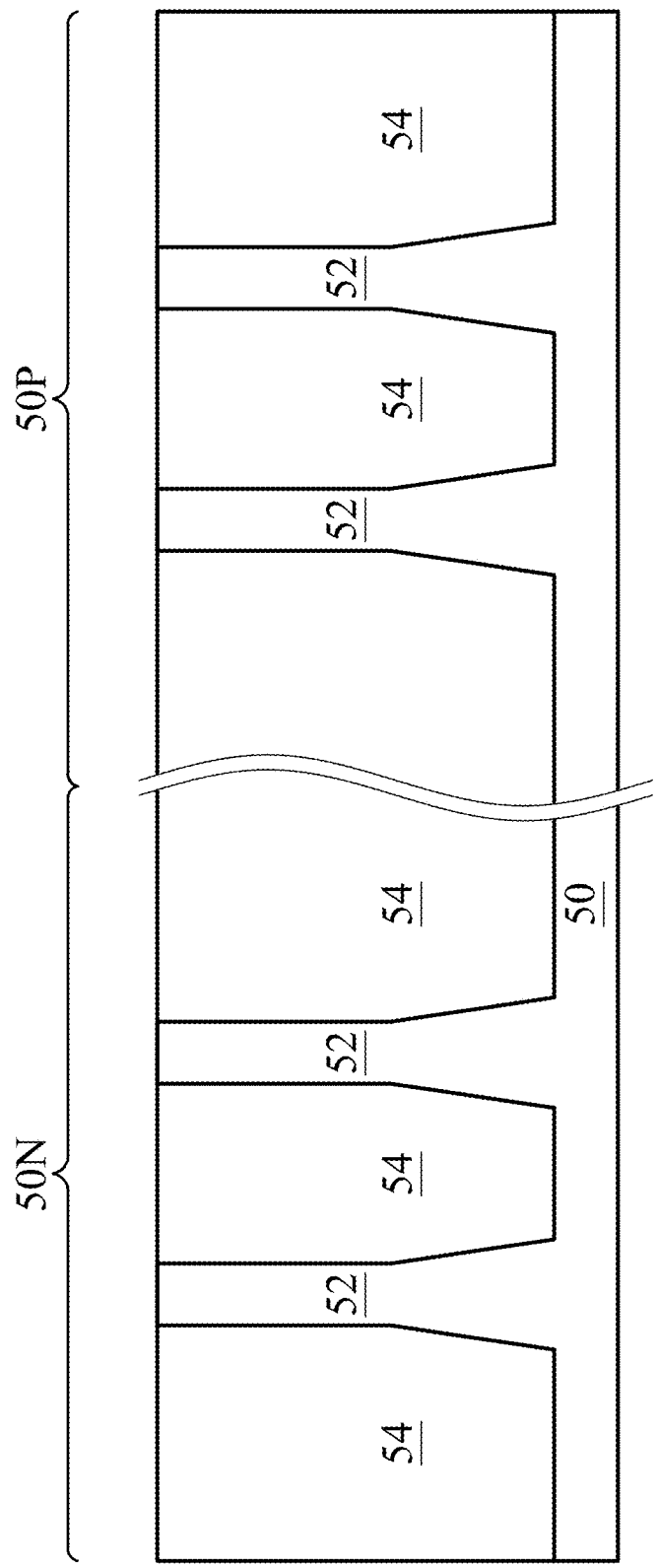

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
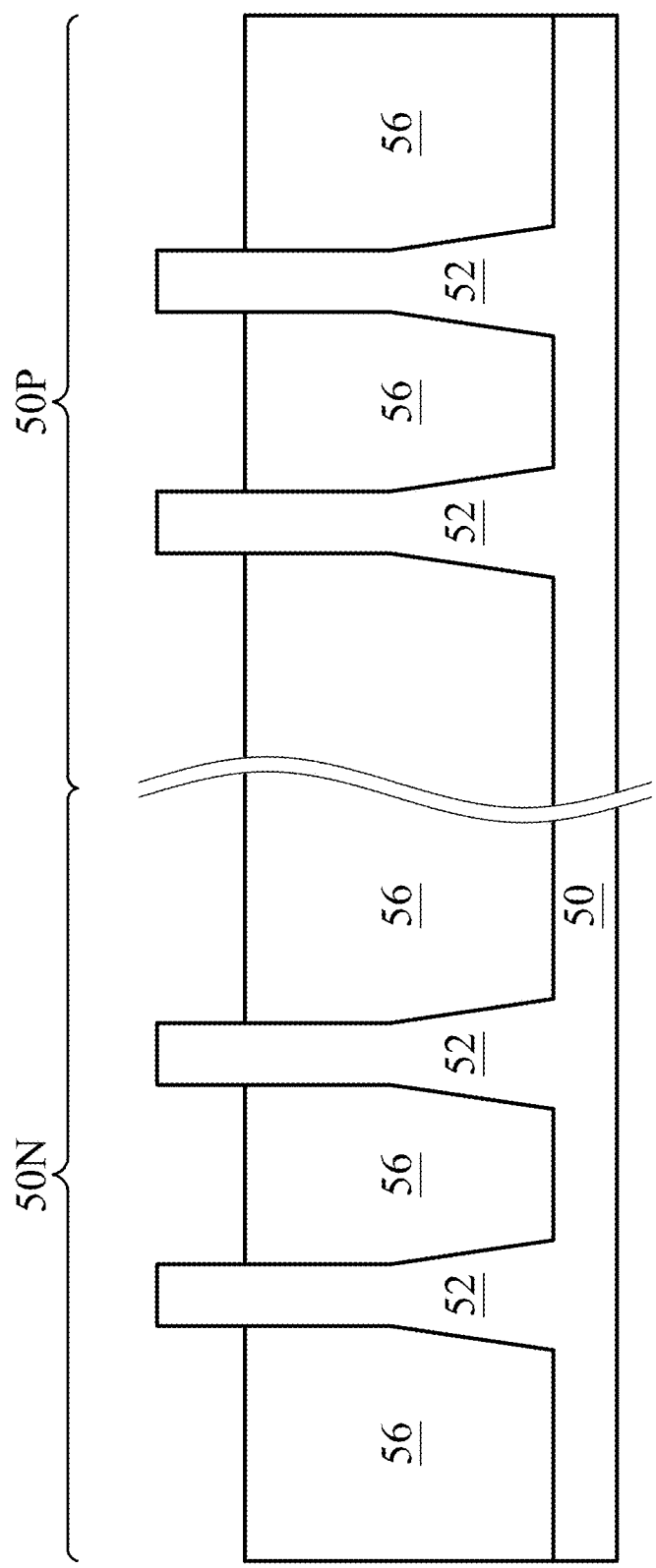

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
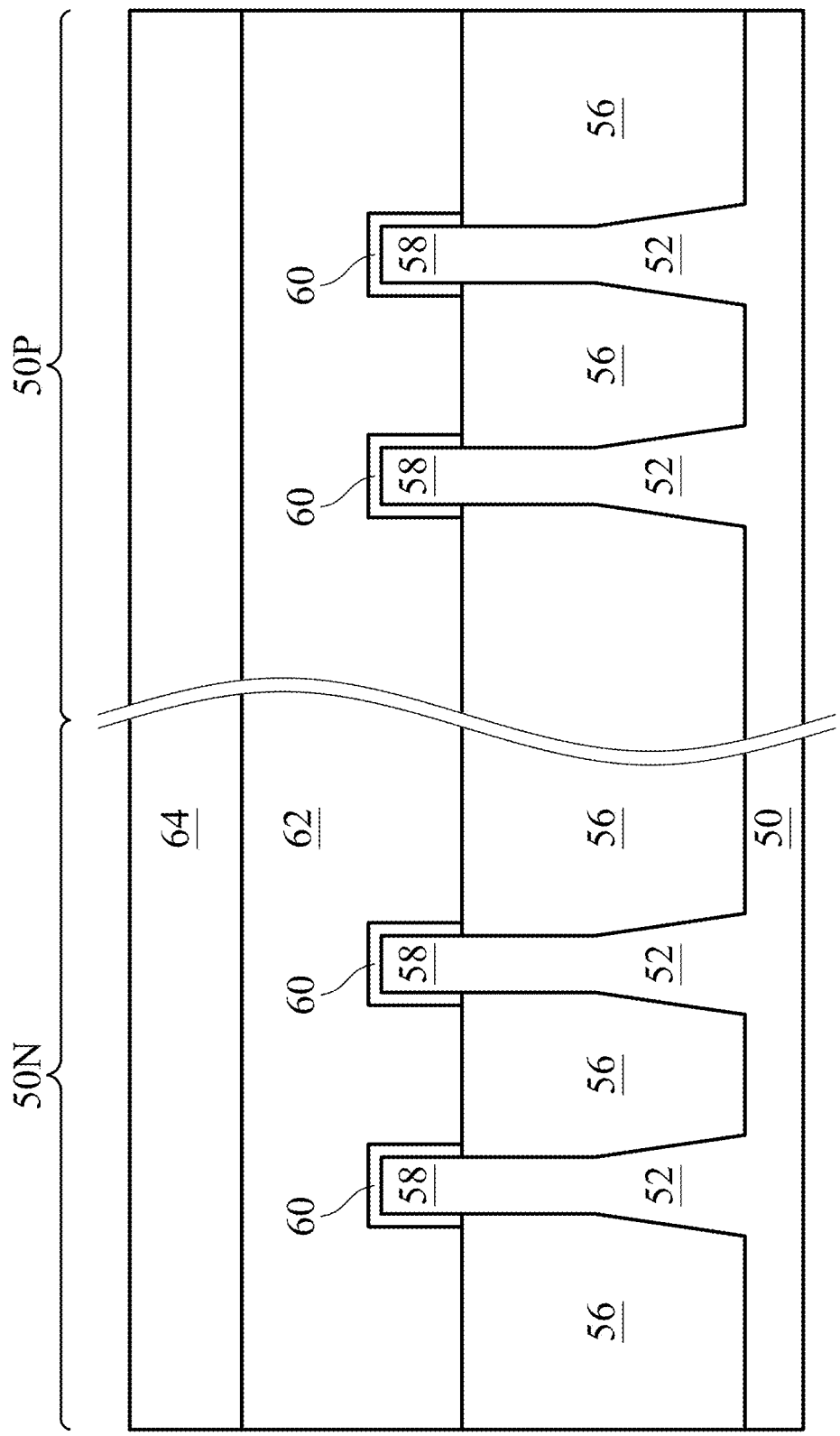

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
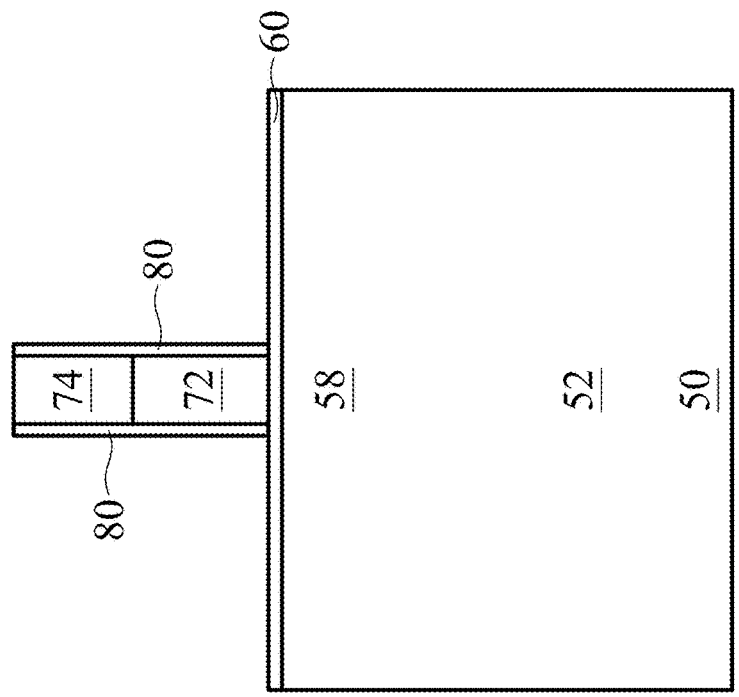
Figure 8A:
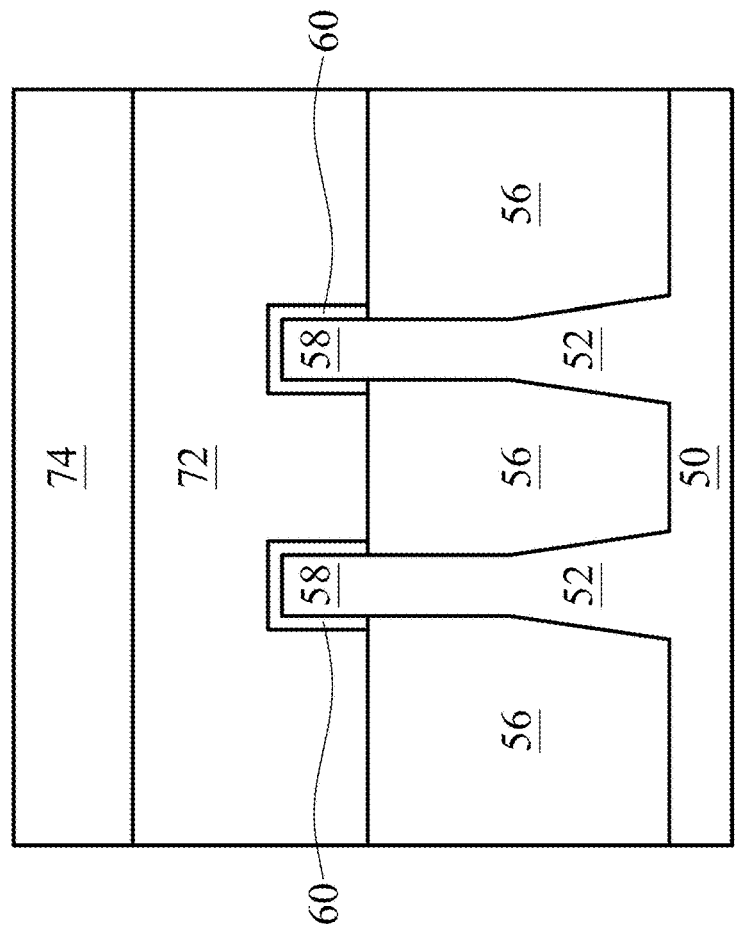
Figure 8C:
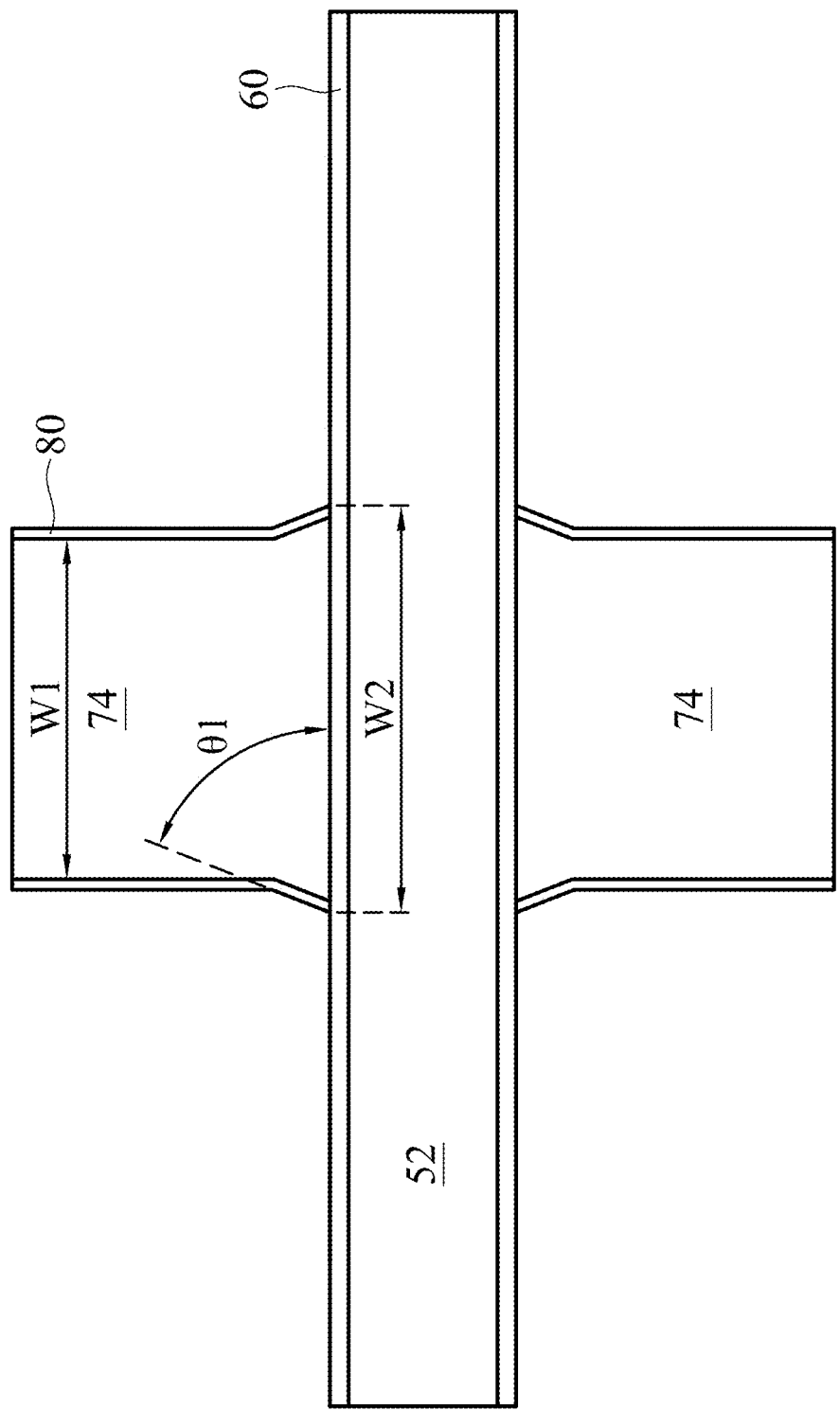

In FIGS. 8A, 8B and 8C, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. In some embodiments, the dummy dielectric layer 60 is not patterned using the masks 74 (as shown in e.g., FIG. 8B). In some embodiments, the dummy dielectric layer 60 may be left unpatterned, for example, to protect the channel regions 58 of the fins 52 or to be subsequently used as an etch stop layer. The dummy gates 72 cover respective channel regions 58 of the fins 52. The pattern of the masks 74 may be used to physically separate each of the dummy gates 72 from adjacent dummy gates. The masks 74 or the dummy gates 72 may also have a lengthwise direction substantially perpendicular to the lengthwise direction of respective epitaxial fins 52, as shown in the plan view of FIG. 8C.

Further in FIGS. 8A-C, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

Referring to FIG. 8C, in some embodiments, the masks 74 or dummy gates 72 may have a flared profile near the fins 52. The flared profile may result, for example, from the topography of the fin 52 sidewall affecting the photolithography and/or etching steps that form the masks 74 or dummy gates 72. In some embodiments, regions of the masks 74 or dummy gates 72 that are away from the fins 52 may have a width W1 that is between about 6 nm and about 500 nm. In some embodiments, regions of the masks 74 or dummy gates 72 that are near the fins 52 may have a width W2 that is between about 6 nm and about 500 nm. In some embodiments, the flared profile may form an approximate angle θ1 with the sidewall of the fin 52 that is between about 20 degrees and about 70 degrees. In some embodiments, the photolithography or etching steps are controlled to produce a desired flared profile of the dummy gates 72 near the fins 52.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the fins 52 in the region 50P. The mask may then be removed. Subsequently, a mask, such as a photoresist, may be formed over the region 50P while exposing the region 50N, and appropriate type impurities (e.g., n-type) may be implanted into the fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities. In some embodiments in which the dummy dielectric layer 60 covers the fins 52, the impurities may be implanted through the dummy dielectric layer 60 and into the fins 52.

Figure 9B:
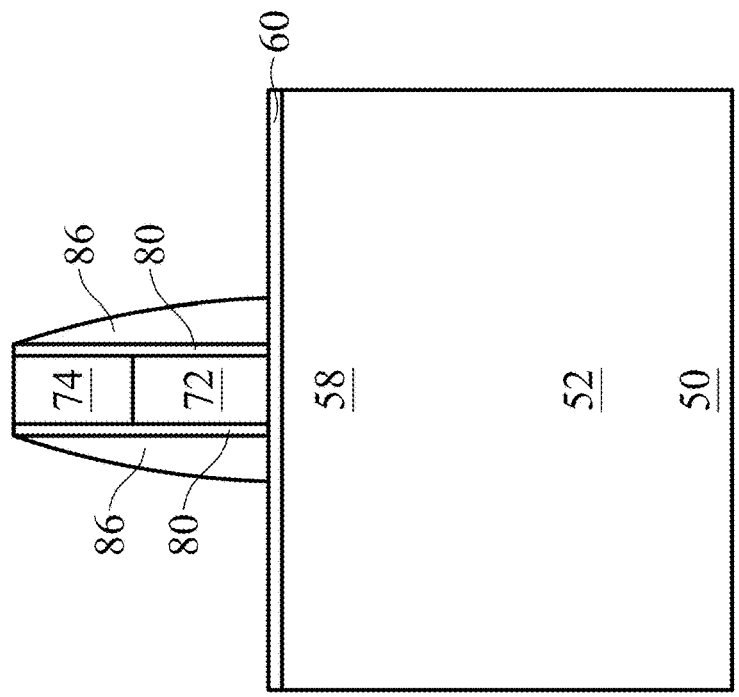
Figure 9A:
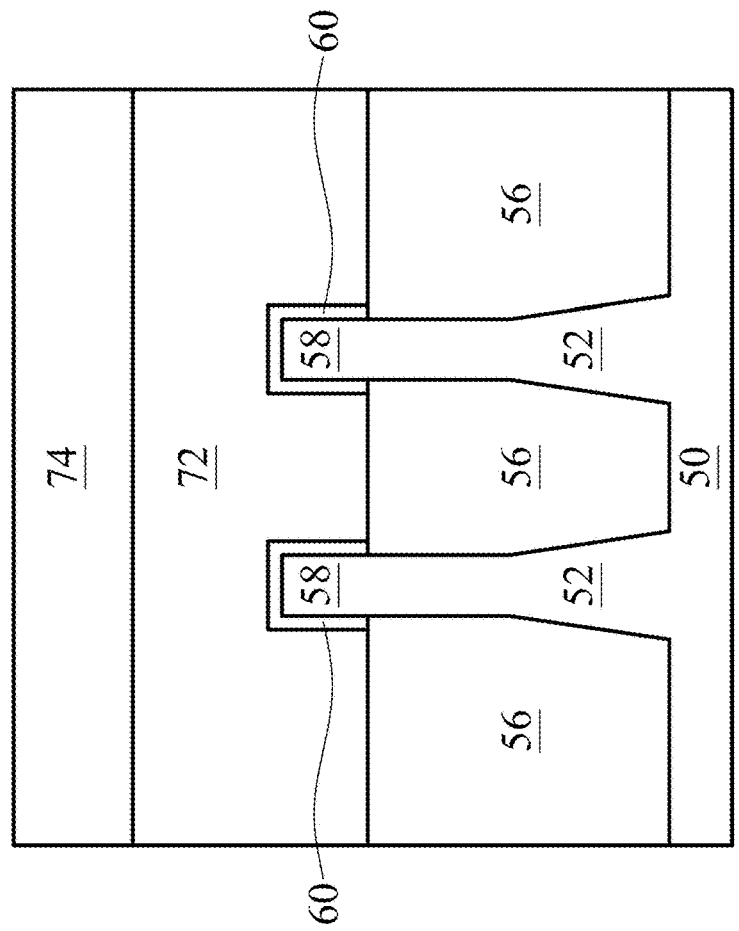
Figure 9C:
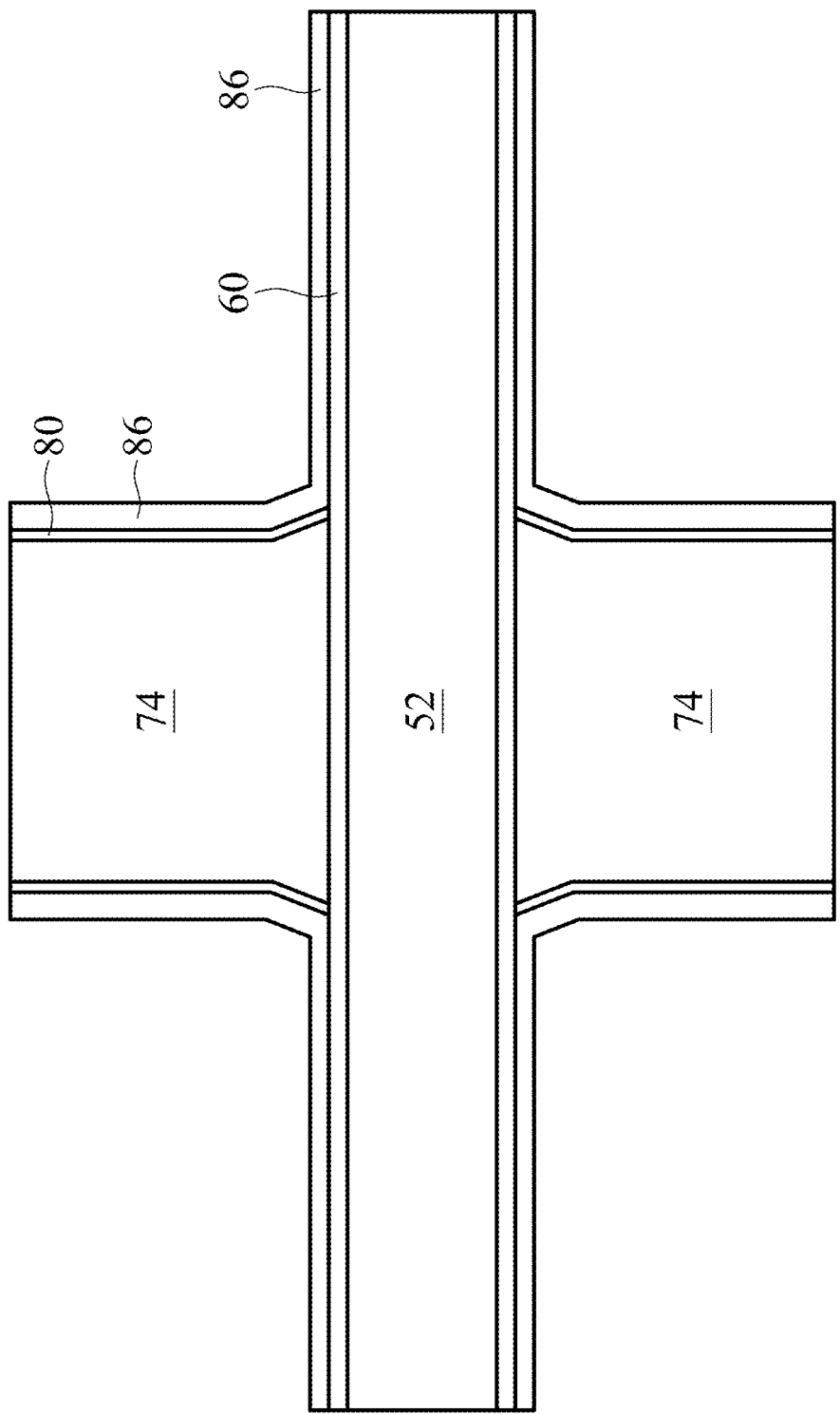

In FIGS. 9A, 9B, and 9C, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 10A, 10B, 10C, 10D, and 10E epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P to form recesses in the fins 52. In some embodiments, the dummy dielectric layer 60 over the fins 52 may be removed in a separate etching step before forming source/drain recesses in the fins 52 using, e.g., a suitable wet etch or dry etch. The fins 52 may be masked such that the dummy dielectric layer 60 on the sidewalls of the fins 52 is not etched when the source/drain recesses are formed, as shown in FIG. 10C. In other embodiments, portions of the dummy dielectric layer 60 on the sidewalls of the fins 52 may be etched as part of forming the recesses for the source/drain regions. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10D. In other embodiments, adjacent source/drain regions 82 remain separated after the epitaxy process is completed as illustrated by FIG. 10E. In the embodiments illustrated in FIGS. 10D and 10E, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 10B:
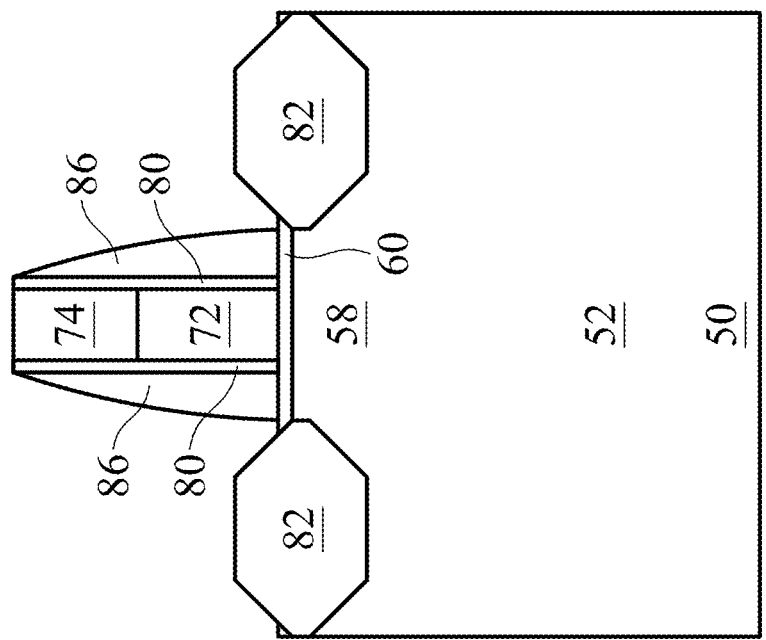
Figure 10A:
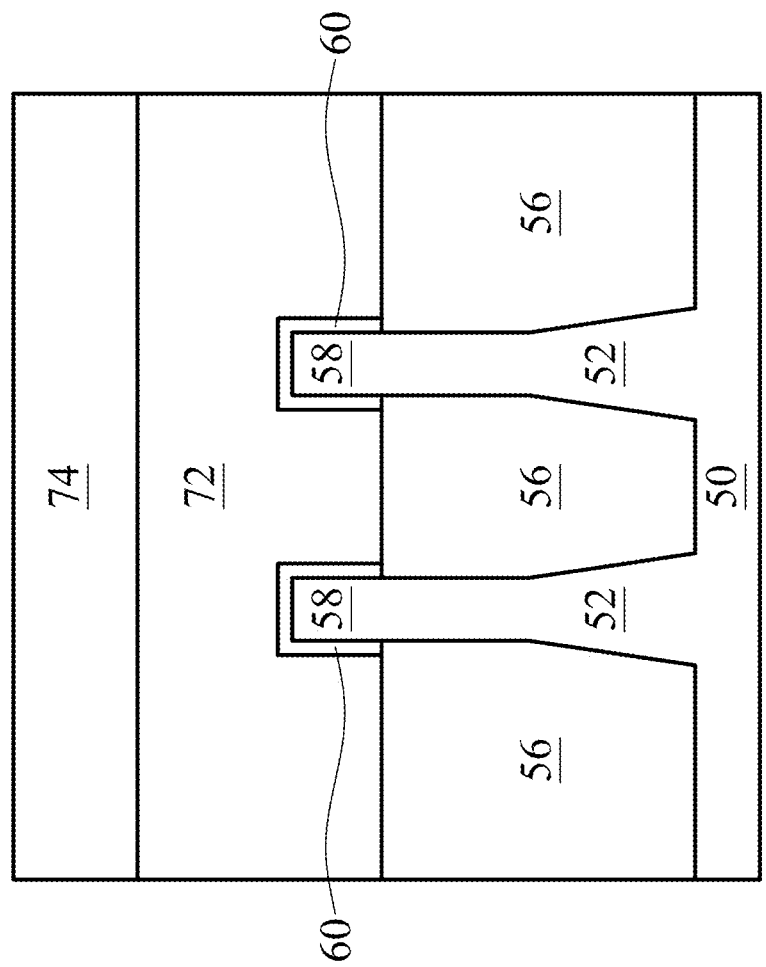
Figure 10C:
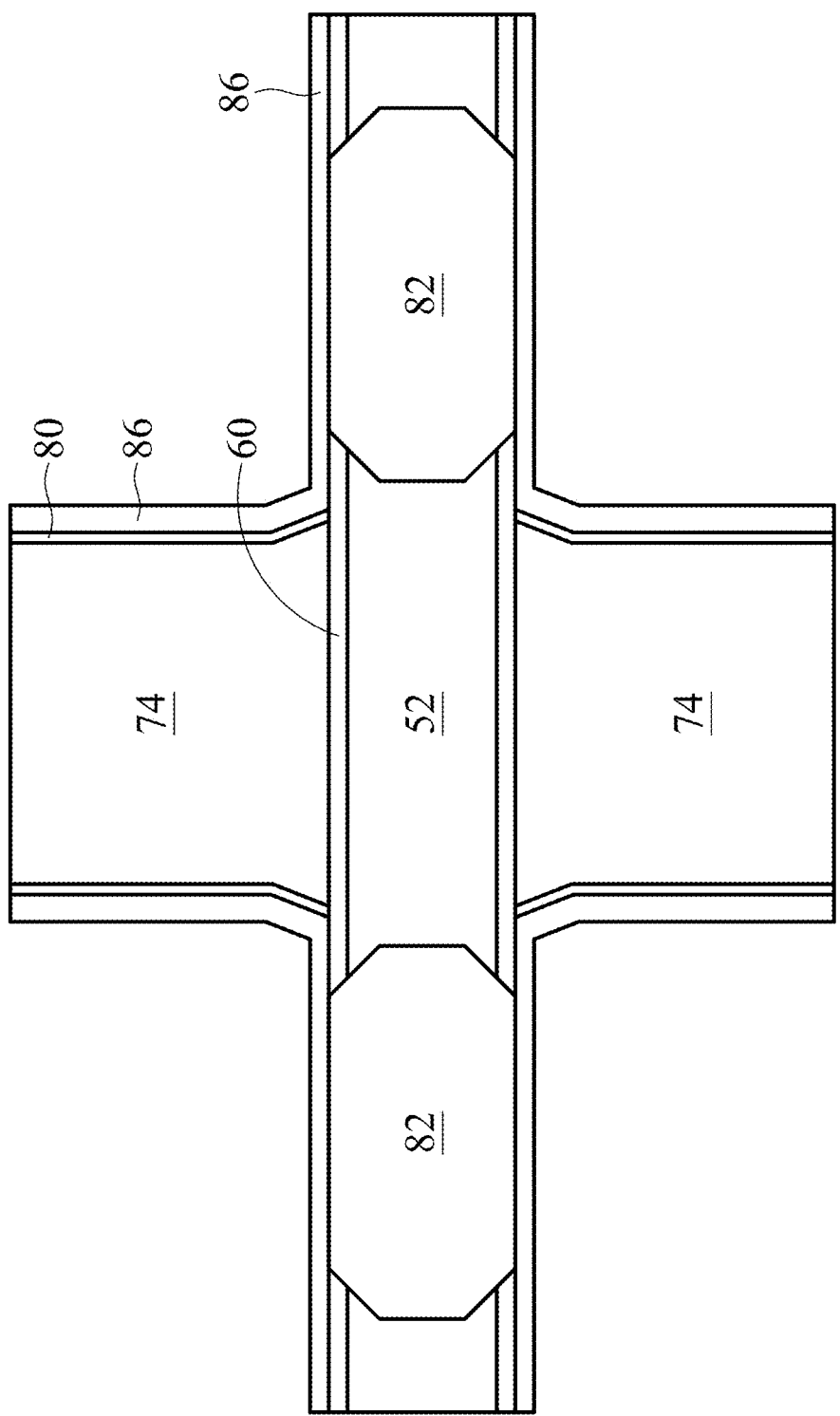
Figure 10E:
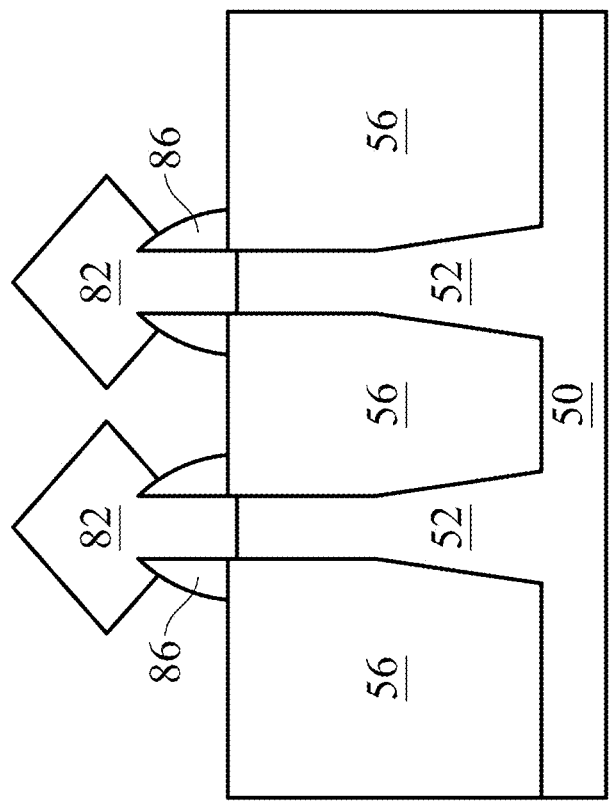
Figure 10D:
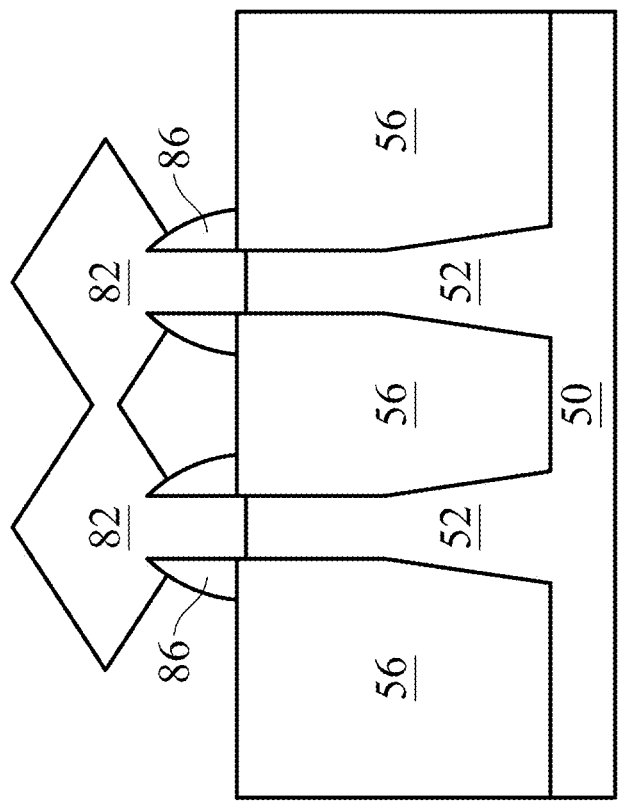
Figure 11B:
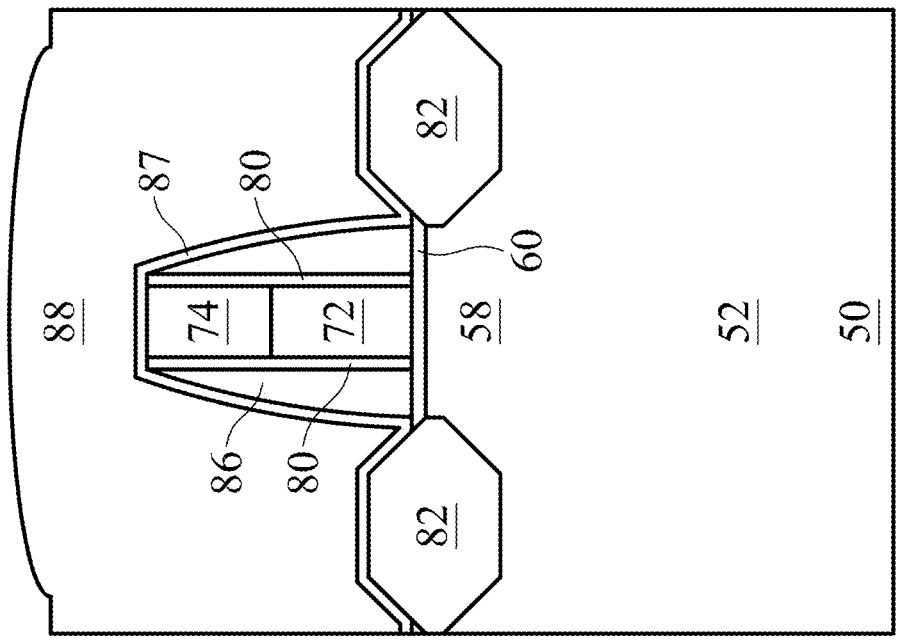
Figure 11A:
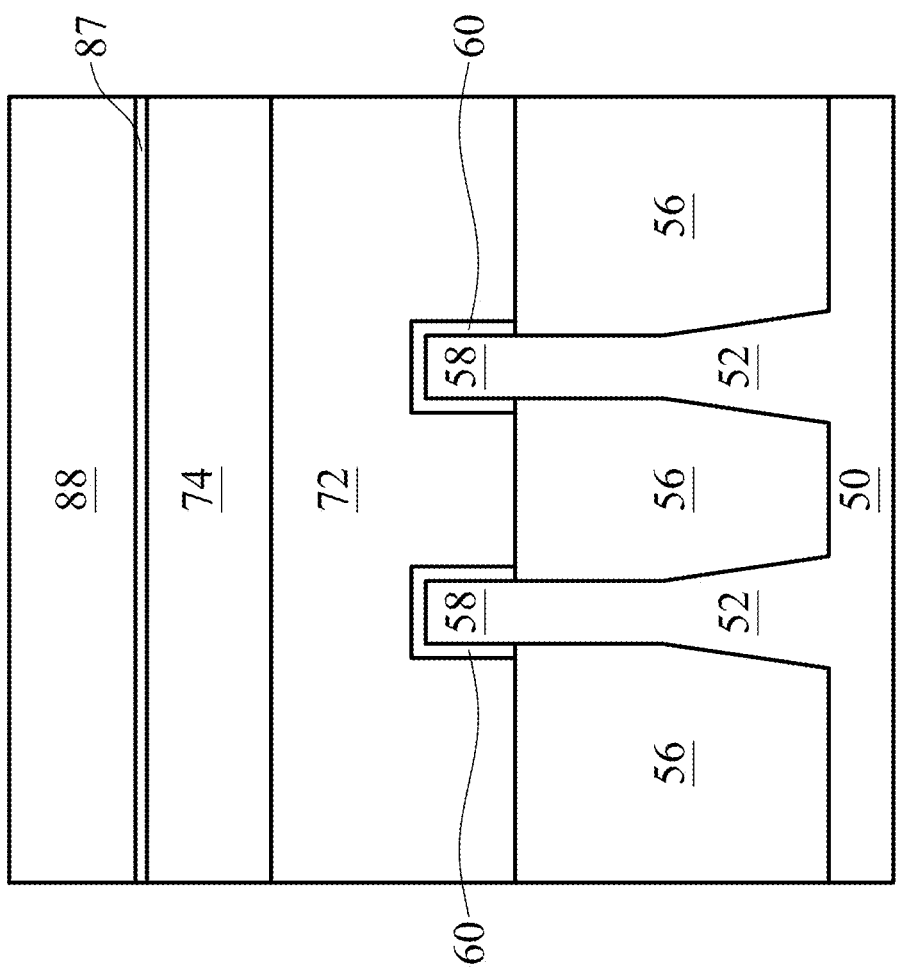

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 12B:
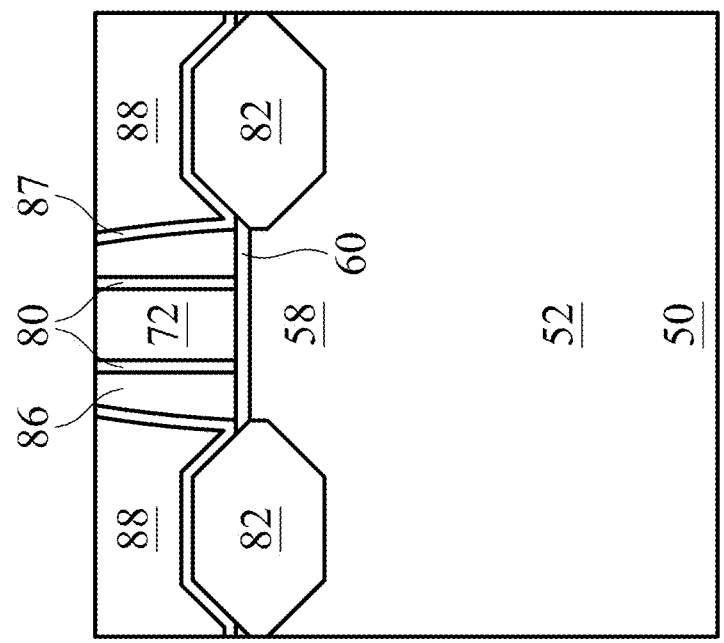
Figure 12A:
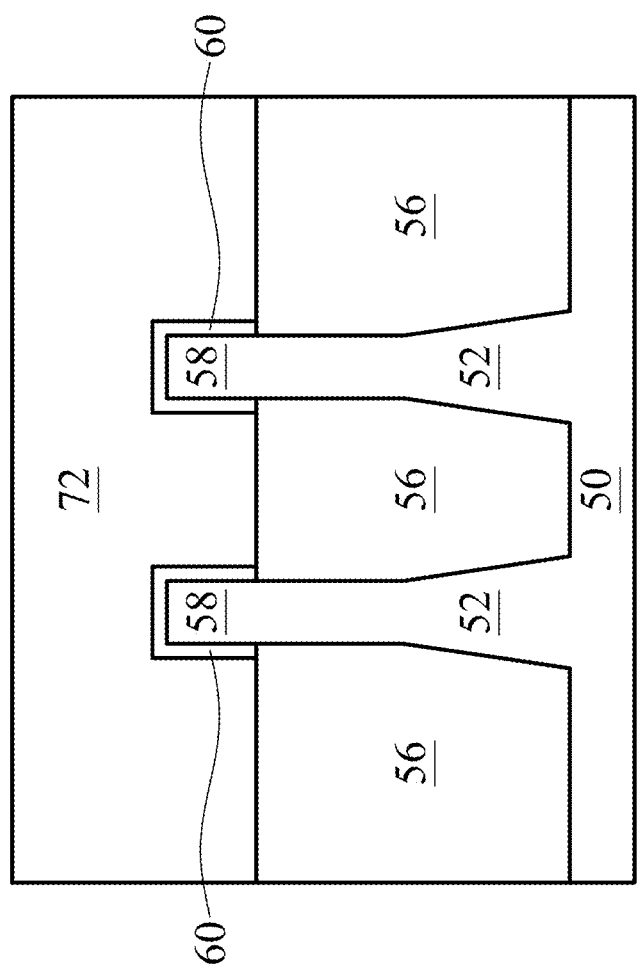
Figure 12C:
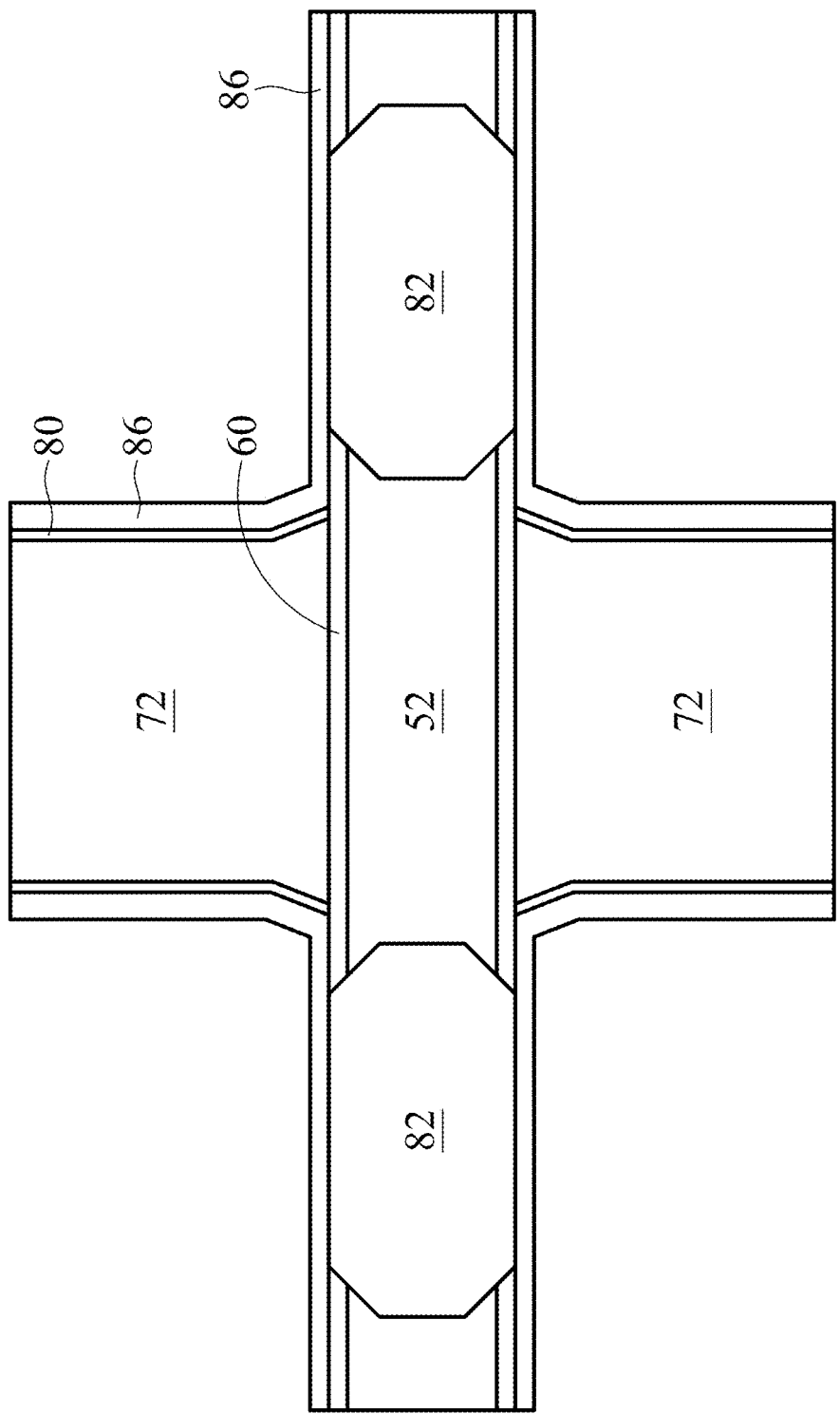

In FIGS. 12A, 12B, and 12C, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
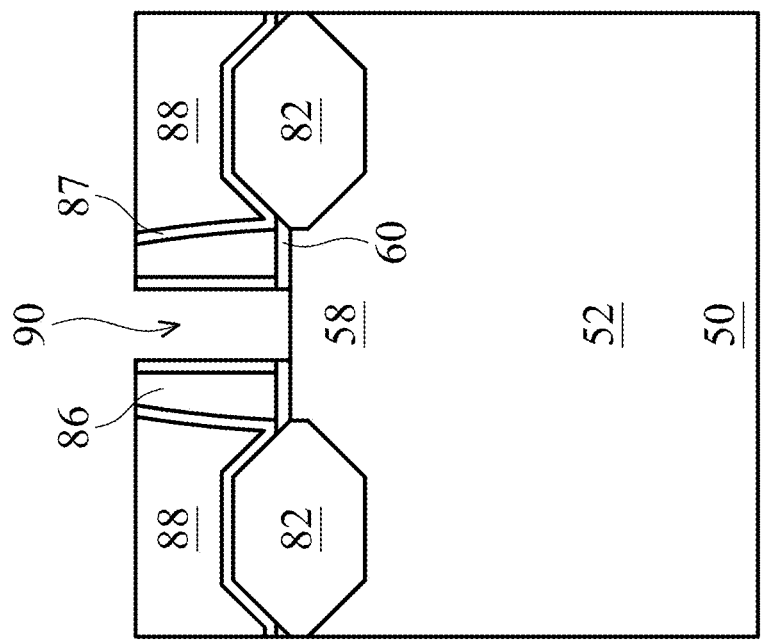
Figure 13A:
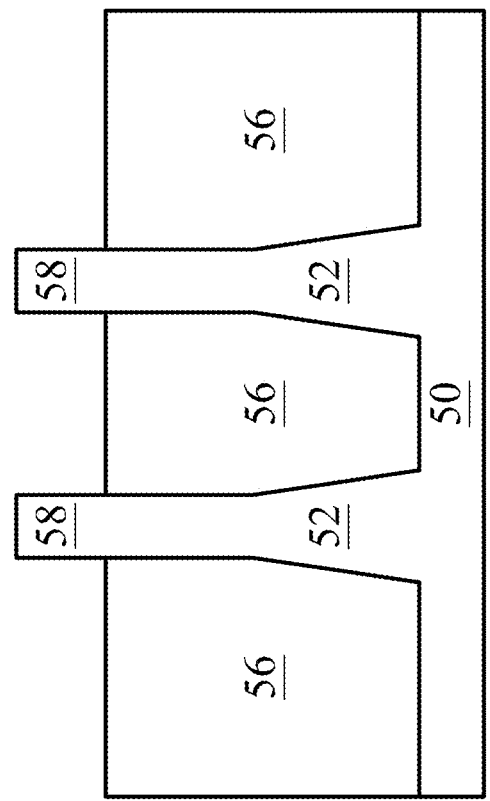
Figure 13C:
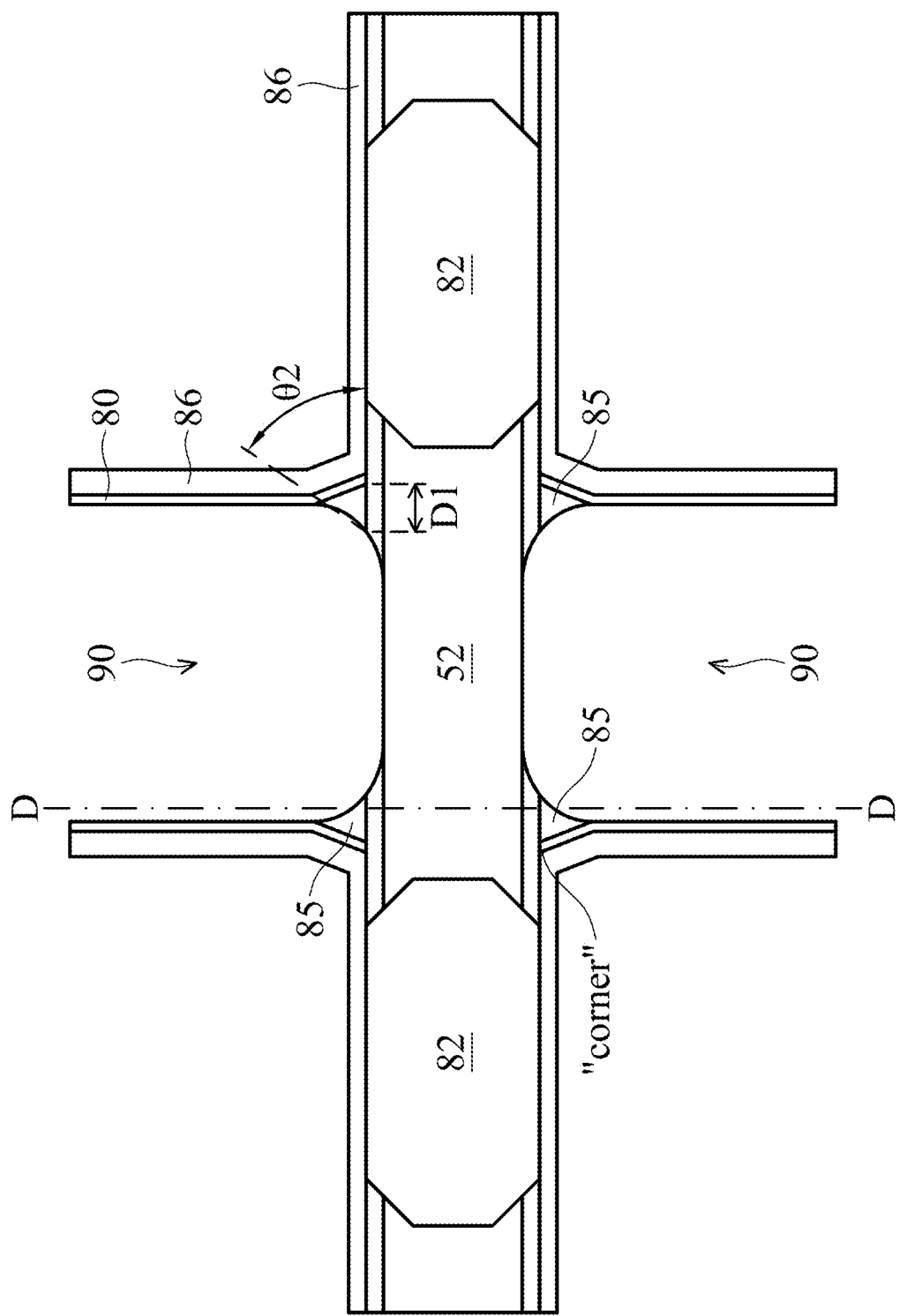
Figure 13D:
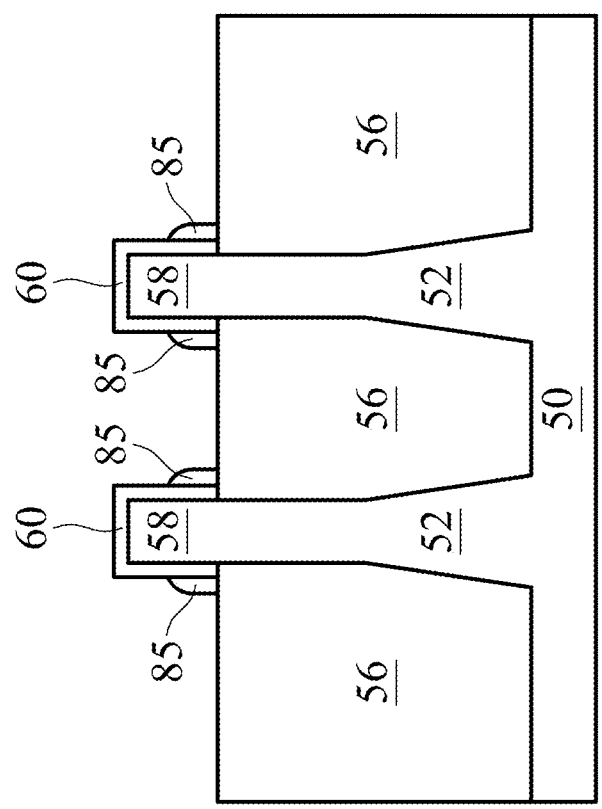

In FIGS. 13A, 13B, 13C, and 13D, the dummy gates 72, and the masks 74 if present, are removed in an etching step(s), so that recesses 90 are formed, in accordance with some embodiments. FIG. 13D is illustrated along reference cross-section D-D as shown in FIG. 13C. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

In some cases during the etching of the dummy gates 72, the etch rate of the dummy gate 72 material near corner regions of the dummy gates 72 may be smaller than the etch rate of the dummy gate 72 material in regions of the dummy gates 72 that are away from the corner regions ("the bulk regions"). For example, the etch rate may be smaller in regions of the dummy gate 72 that are near corners defined by a sidewall of a gate spacer 86 and a sidewall of a fin 52, an example of which is labeled as "corner" in FIG. 13C. In some cases, the etch rate of corner regions may be between 10% and 60% of the etch rate of bulk regions. The smaller etch rate of regions near corners may be due to, for example, reduced etchant mobility in the corner regions (e.g., limited etchant movement due to the partial confinement of the etchants by the sidewalls), less exposed dummy gate 72 material in the corner regions, depletion of active etchants in the corner regions (e.g., limited ability of depleted etchants to be replaced by fresh etchants due to the sidewalls), or other factors.

In some embodiments, the etching step(s) are performed such that portions of the dummy gates 72 in corner regions remain after the etching step(s) have been performed. Example remaining portions are shown in FIG. 13C and FIG. 13D as remnants 85, located at the corners defined by the gate spacers 86 and the fin 52. The remnants 85 are regions of the dummy gates 72 that have been incompletely etched after the etching step(s) have been performed, and as such may comprise a similar material as the dummy gates 72 (e.g., silicon, silicon oxide, a combination, or the like). As described above, corner regions of the dummy gates 72 may have a smaller etch rate than bulk regions. Accordingly, the remnants 85 may be formed in some embodiments by limiting the time duration of the etching step(s) such that the bulk regions of the dummy gate 72 are removed before the corner regions of the dummy gate 72 have been removed. In some embodiments, an etching process may be stopped when the desired characteristics (e.g., size, shape) of the remnants 85 have been achieved. In some embodiments, the remnants 85 may extend a distance D1 parallel to the fin 52 as measured from a corner of a dummy gate 72 that is between about 2 nm and about 30 nm. In some embodiments, the remnants 85 may have a thickness that is between about 2 nm and about 20 nm.

In some embodiments, flared profile of the dummy gates 72 near the fins 52 can affect the shape or size of the remnants 85. For example, a larger width W2 (see FIG. 8C) can form remnants 85 that extend a longer distance D1 from the corners. In some embodiments, the distance D1 may be between about 20% and about 50% of the width W2. In some embodiments, the remnants 85 may have an approximately triangular shape in plain view, though the remnants 85 may have other shapes in other embodiments. In some embodiments, the remnants 85 may have an approximately triangular shape forming an approximate angle θ2 with the sidewall of the fin 52, as shown in FIG. 13C. In some embodiments, the angle θ2 may be between about 10 degrees and about 60 degrees. As shown in FIG. 13D, the remnants 85 may extend partially up the sidewalls of the fin 52 protruding above the isolation regions 56. The remnants 85 may extend fully up the protruding sidewalls of the fins 52, or may extend a different amount than shown in FIG. 13D. For example, the remnants 85 may extend more or less than shown in a different cross-section of the same structure. In other embodiments, the remnants 85 may have different sizes or shapes than shown in FIGS. 13C and 13D, and such variations are considered within the scope of this disclosure.

In some embodiments, the dummy gates 72 are removed by etching step(s) that include an anisotropic dry etching process. The anisotropic dry etching process may include using reaction gas(es) that selectively etch the dummy gates 72 without etching the first ILD 88 or the gate spacers 86. In some embodiments, the anisotropic dry etching process includes generating a plasma with a power between about 50 Watts and about 1500 Watts. The anisotropic dry etching process may be performed at a pressure between about 50 mTorr and about 5000 mTorr and at a process temperature between about 40° C. and about 80° C. In some embodiments, the anisotropic dry etching process may use one or more process gases such as HBr, $Cl_2$, $H_2$, $N_2$, $O_2$, $C_xF_y$, $CH_xF_y$, another type of process gas, or a combination.

Figure 14B:
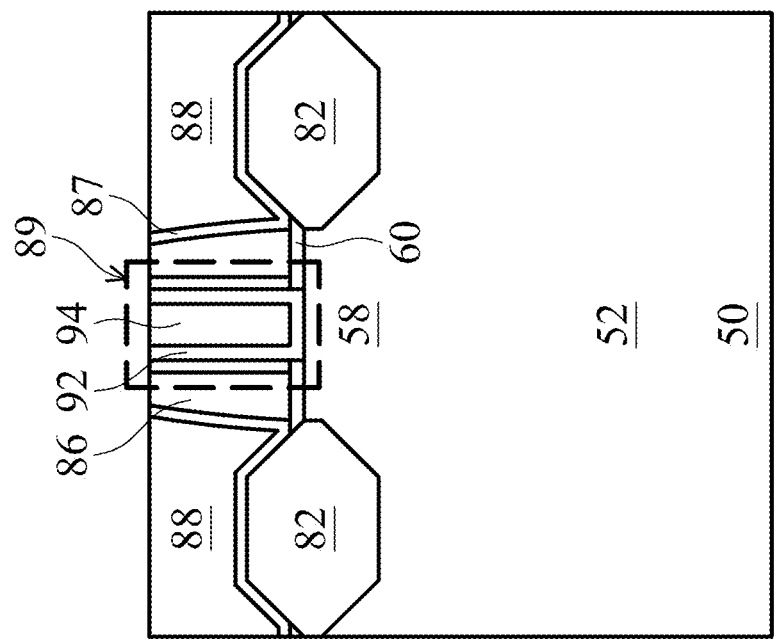
Figure 14A:
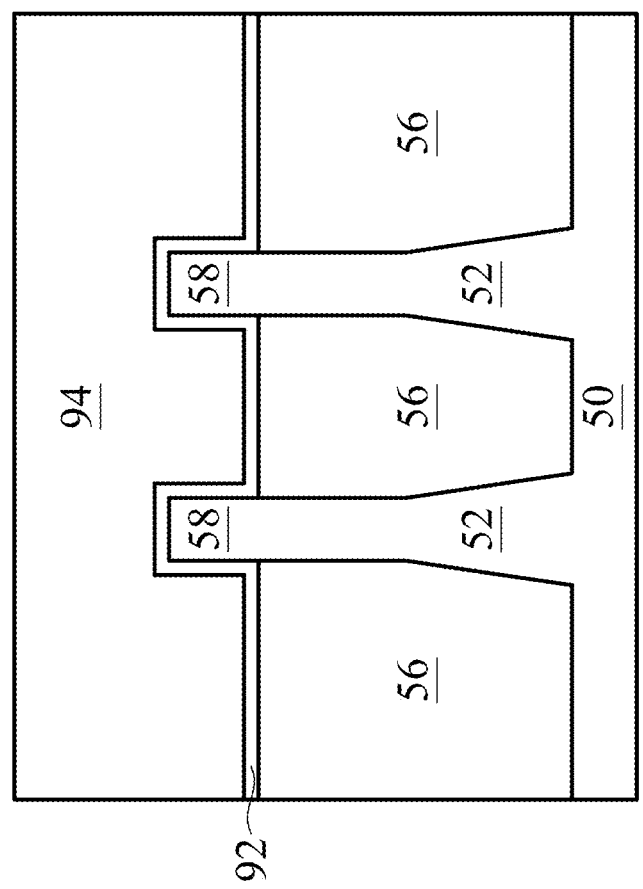
Figure 14C:
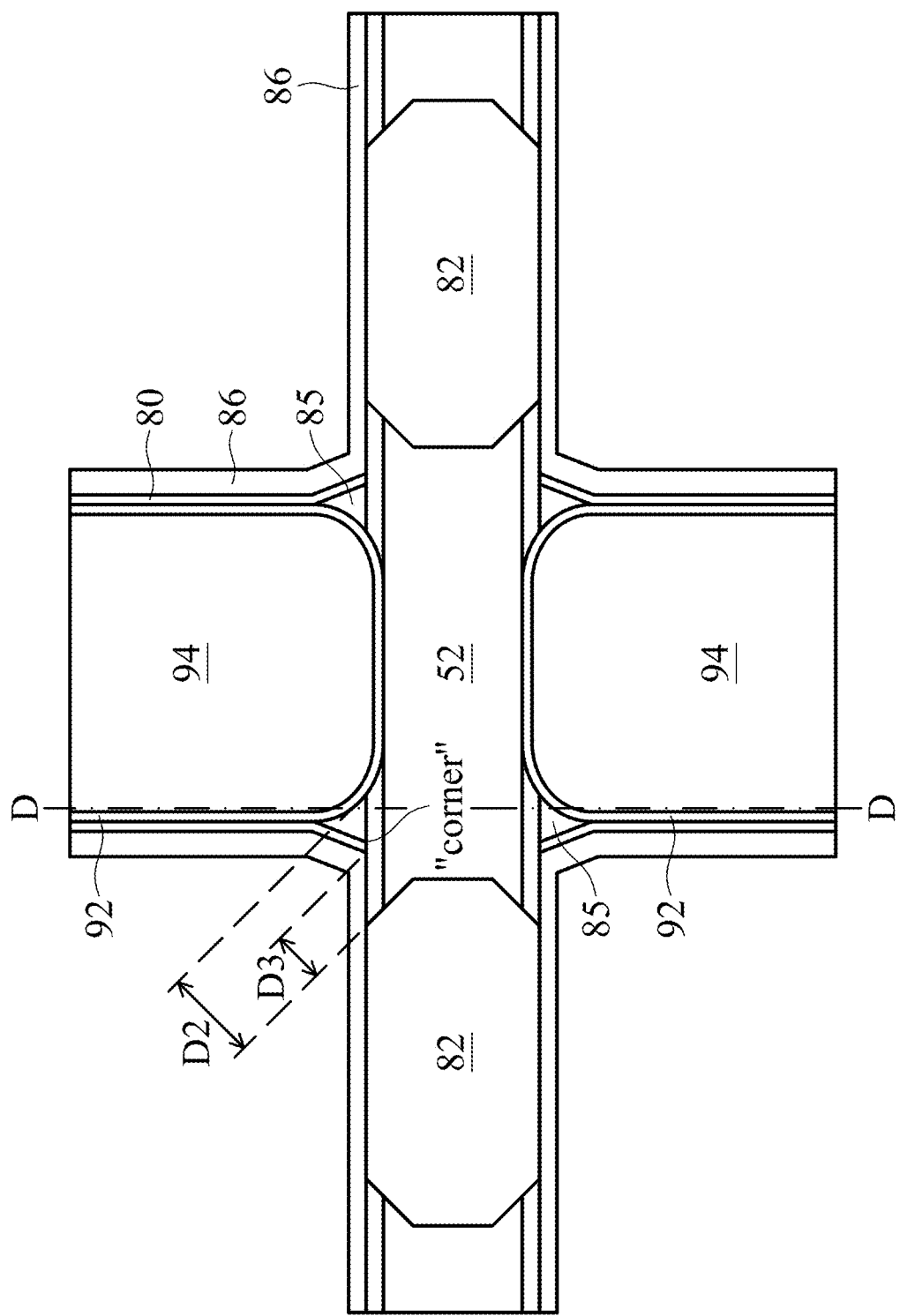
Figure 14D:
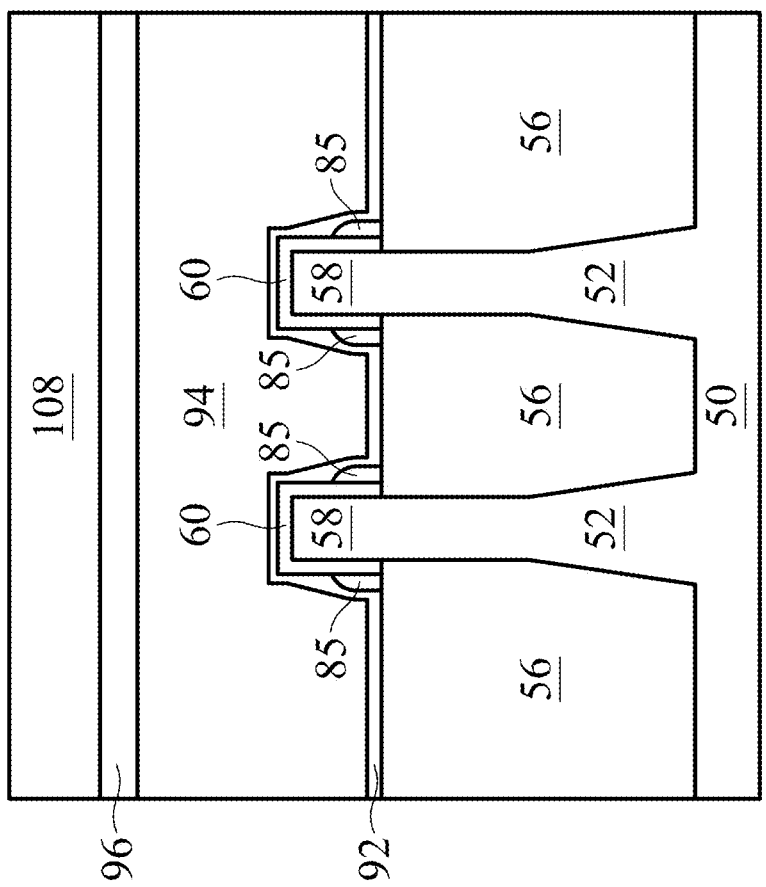
Figure 14E:
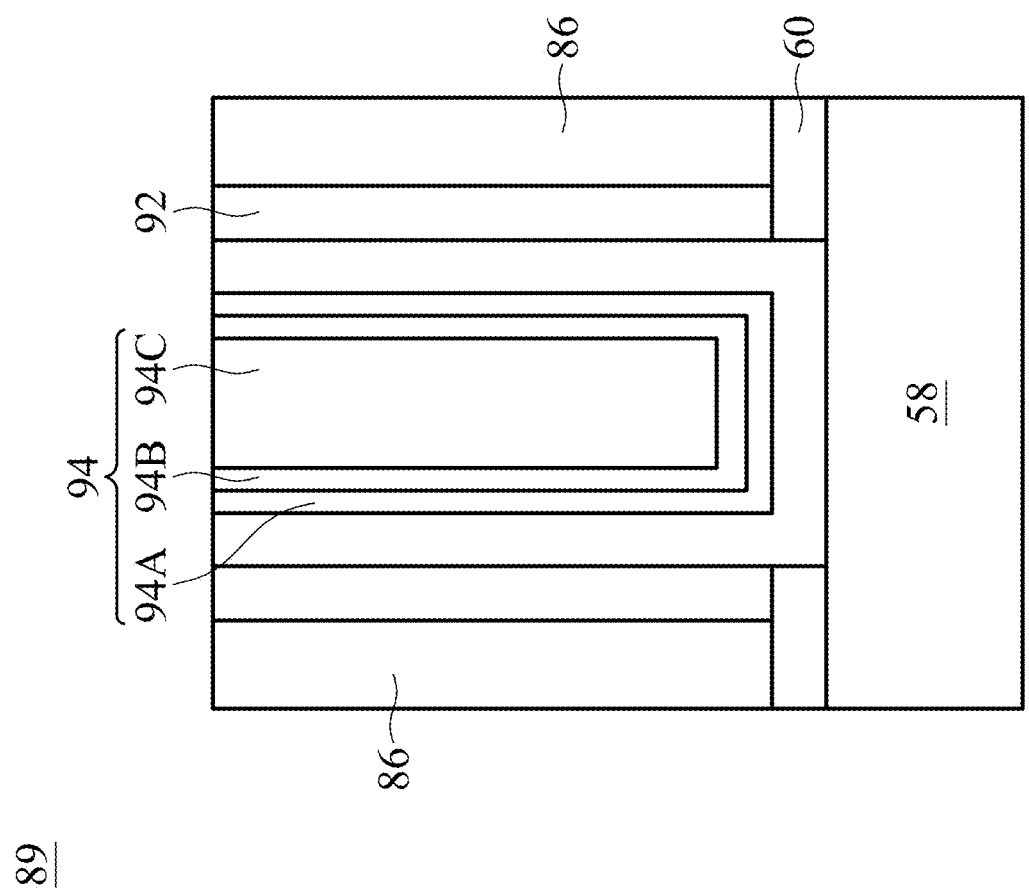

In FIGS. 14A, 14B, 14C, 14D, and 14E, gate dielectric layers 92 and gate electrodes 94 are formed for replacement gates, in accordance with some embodiments. FIG. 14E illustrates a detailed view of region 89 of FIG. 14B and FIG. 14D is illustrated along reference cross-section D-D as shown in FIG. 14C. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multi-layers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14E. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

As shown in FIGS. 14C and 14D, the presence of the remnants 85 blocks the gate stack from being formed in the corners formed by the gate spacers 86 and fins 52 (an example is labeled as "corner" in FIG. 14C). In some embodiments, the presence of the remnants 85 causes the gate stack to be formed having rounded edges or chamfered edges. For example, the shape of a gate stack near a fin 52 may be shaped approximately like a rectangle with rounded corners (e.g., a "stadium" shape or oval shape) or approximately like a rectangle with chamfered corners. In some cases, the corners of the gate stack may be approximately chamfered at an angle that is about the same as the angle θ2 of the remnants (see FIG. 13C).

In some embodiments, remnants 85 are formed to increase the separation between the gate stack and the epitaxial source/drain regions 82. For example, due to the presence of the remnants 85, the distance D2 between the gate stack and the epitaxial source/drain regions 82 is greater than the distance D3 between the corners and the epitaxial source/drain regions 82. In some cases, increasing the distance between the gate stack and the epitaxial source/drain regions 82 can reduce current leakage between the gate stack and the epitaxial source/drain regions 82. Additionally, increasing the distance between the gate stack and the epitaxial source/drain regions 82 can reduce the chance of shorts (e.g. due to conductive residue) between the gate stack and the epitaxial source/drain regions 82 forming during processing. This can improve the yield with respect to process variation.

Figure 15B:
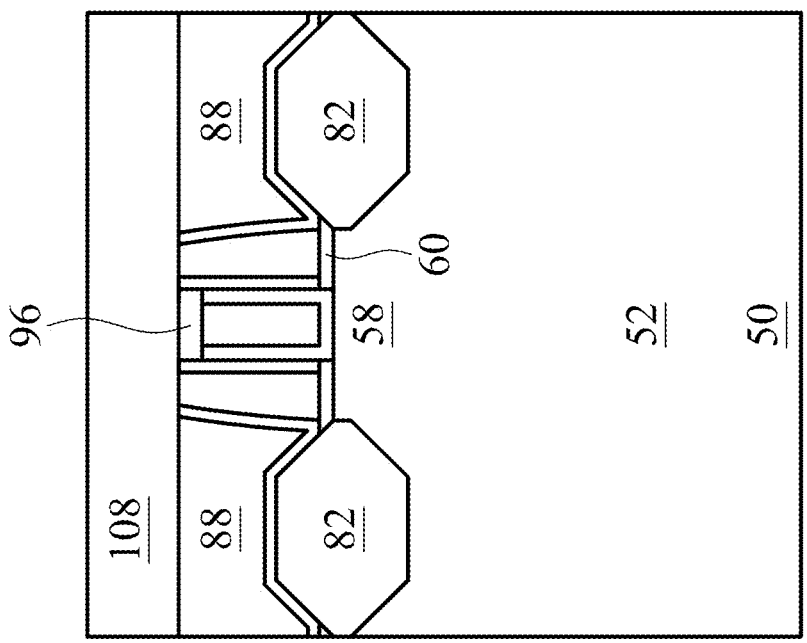
Figure 15A:
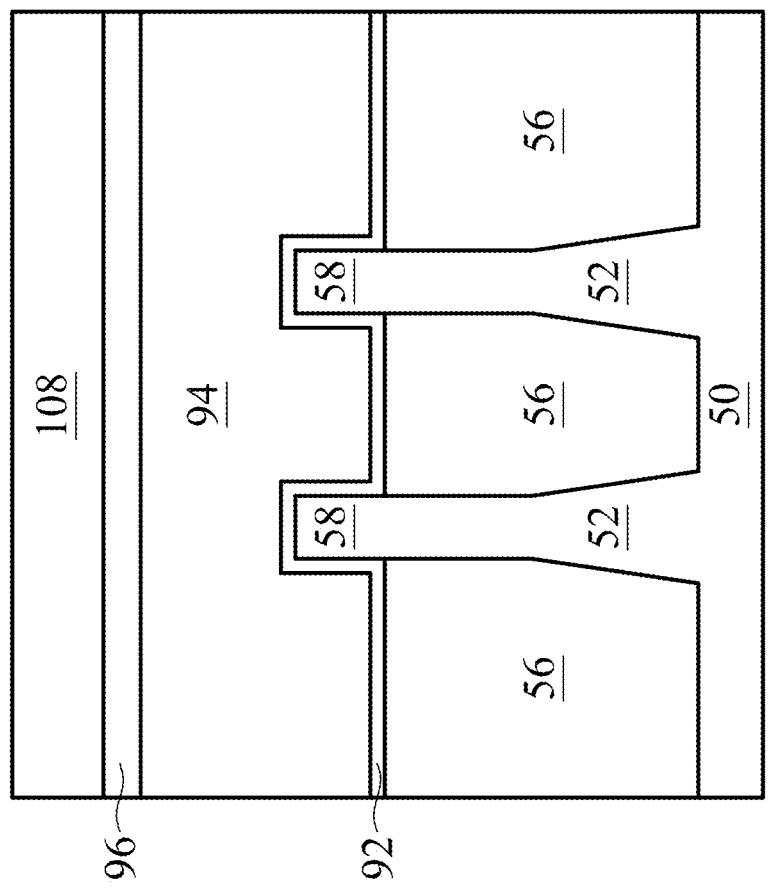

Turning to FIGS. 15A and 15B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 15A and 15B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 16A and 16B) penetrate through the gate mask 96 to contact the top surface of the recessed gate electrode 94.

Figure 16B:
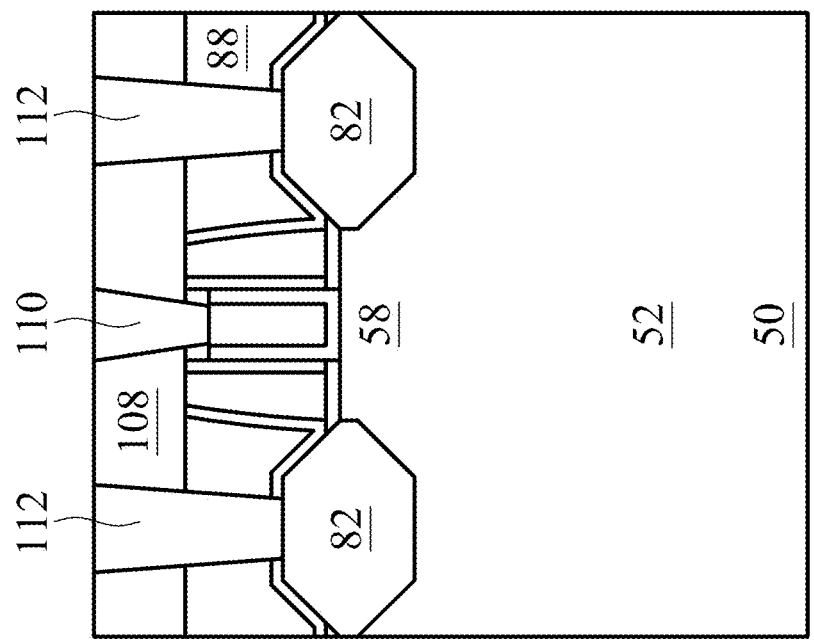
Figure 16A:
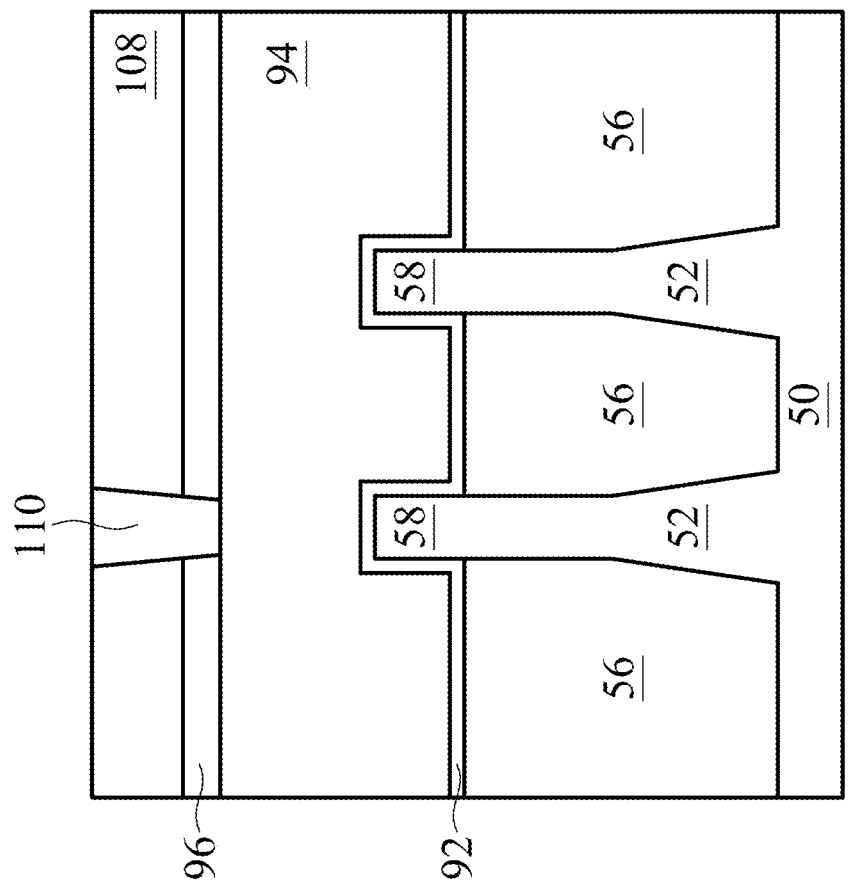

In FIGS. 16A and 16B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

In an embodiment, a method of forming a semiconductor device includes forming a fin on a substrate, forming a first isolation region surrounding the fin, a upper region of the fin protruding above the first isolation region, forming a dummy gate structure extending over the first isolation region and the upper region, forming a spacer layer on sidewalls of the dummy gate structure and on sidewalls of the upper region, epitaxially growing a source/drain region adjacent the channel region, performing an etching process on the dummy gate structure to form a recess in the dummy gate structure, wherein the etching process exposes the sidewall of the upper region, wherein after performing the etching process, portions of the dummy gate structure remain on the sidewall of the upper region located between the exposed sidewall of the upper region and the spacer layer, and forming a replacement gate structure in the recess, wherein portions of the replacement gate structure are separated from the upper region by the remaining portions of the dummy gate structure. In an embodiment, a first portion of the dummy gate structure that is adjacent the fin has a first width and wherein a second portion of the dummy gate structure that is away from the fin has a second width that is smaller than the first width. In an embodiment, the remaining portions of the dummy gate structure extend along the sidewalls of the spacer layer. In an embodiment, the etching process exposes sidewalls of the spacer layer that are adjacent to the remaining portions of the dummy gate structure. In an embodiment, the etching process includes using an anisotropic dry etching process. In an embodiment, forming the dummy gate structure includes forming a dummy gate layer over the first isolation region and over the upper region and forming a mask layer over the dummy gate layer, and wherein performing the etching process includes etching the mask layer using a first etching step to remove the mask layer and etching the dummy gate layer using a second etching step. In an embodiment, the recess in the dummy gate structure has a chamfered shape in a plan view. In an embodiment, the recess in the dummy gate structure has a chamfered shape with chamfered edges at an angle between 20 degrees and 60 degrees from the fin. In an embodiment, the recess in the dummy gate structure has a stadium shape in a plan view.

In an embodiment, a method of forming a semiconductor device includes forming a semiconductor fin protruding from a substrate, forming a dummy gate over the semiconductor fin, forming gate spacers on sidewalls of the dummy gate, performing an etching process on the dummy gate, wherein the etching process includes simultaneously etching first portions of the dummy gate at a first etching rate and etching second portions of the dummy gate at a second etching rate that is greater than this first etching rate, wherein each first portion of the dummy gate includes a first surface over a sidewall of a gate spacer and a second surface over a sidewall of the semiconductor fin, wherein the second portions of the dummy gate are adjacent the first portions, and stopping the etching process after the second portions of the dummy gate are removed, wherein the first portions of the dummy gate remain after stopping the etching process, forming a gate dielectric over the semiconductor fin and over the first portions of the dummy gate, and forming a gate electrode over the gate dielectric. In an embodiment, each first portion of the dummy gate has a triangular shape in a plan view. In an embodiment, the method includes forming epitaxial source/drain regions in the semiconductor fin adjacent the dummy gate dielectric, wherein the first portions of the dummy gate are closer to the epitaxial source/drain regions than the second portions of the dummy gate. In an embodiment, the first etching rate is between 20% and 60% of the second etching rate. In an embodiment, the method includes forming a dummy dielectric layer over the semiconductor fin before forming the dummy gate, wherein the second surfaces of the first portions of the dummy gate are on the dummy dielectric layer. In an embodiment, the first surfaces of the first portions of the dummy gate form an angle between 20 degrees and 60 degrees from the semiconductor fin. In an embodiment, the first surfaces of the second portions of the dummy gate extend along the semiconductor fin a distance between 2 nm and 30 nm.

In an embodiment, a semiconductor device includes a fin extending from a substrate, a gate stack over and along a sidewall of the fin, a spacer along a first sidewall of the gate stack and the sidewall of the fin, a dummy gate material along the sidewall of the fin, wherein the dummy gate material is between the spacer and the gate stack, and a first epitaxial source/drain region in the fin and adjacent the gate stack. In an embodiment, the dummy gate material is between the first epitaxial source/drain region and the gate stack. In an embodiment, the dummy gate material includes silicon oxide. In an embodiment, the gate stack includes a second sidewall that extends along the dummy gate material at an angle that is between 20 degrees and 60 degrees with respect to the sidewall of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin extending from a substrate, the fin having an upper surface, a first sidewall, and a second sidewall;
an isolation region along a sidewall of the fin, the fin extending higher than an upper surface of the isolation region;
a gate structure over the fin and the upper surface of the isolation region, the gate structure comprising a gate dielectric layer and a gate electrode;
a dielectric layer adjacent to the first sidewall of the fin and the gate structure in a top-down view;

a spacer structure contacting a first sidewall of the gate structure;

a corner structure between the spacer structure and the gate structure on the first sidewall of the fin in the top-down view, wherein the corner structure is a separate element from the spacer structure, wherein the dielectric layer is between the corner structure and the fin; and an epitaxial source/drain region adjacent to the gate structure.

2. The semiconductor device of claim 1, wherein a distance between the epitaxial source/drain region and the gate structure on the sidewall of the fin is greater than a distance between the epitaxial source/drain region and the corner structure on the sidewall of the fin in the top-down view.

3. The semiconductor device of claim 1, wherein a width of the corner structure decreases as the corner structure extends away from the fin.

4. The semiconductor device of claim 1, wherein the dielectric layer contacts the epitaxial source/drain region.

5. The semiconductor device of claim 1, wherein the spacer structure contacts the dielectric layer.

6. The semiconductor device of claim 1, wherein an interface between the corner structure and the gate structure is curved.

7. The semiconductor device of claim 1, wherein the dielectric layer extends past opposite sidewalls of the corner structure.

8. A semiconductor device, comprising:
a fin extending from a substrate, the fin having an upper surface, a first sidewall, and a second sidewall;
an isolation region along the first sidewall and the second sidewall of the fin, the fin protruding above the isolation region;
a gate structure on the first sidewall of the fin and an upper surface of the isolation region, wherein the gate structure includes a conductive gate electrode;
a source/drain region in the fin and adjacent to the gate structure;
a dielectric layer on the first sidewall of the fin extending from the gate structure to the source/drain region;
a spacer on the dielectric layer on the first sidewall of the fin, the spacer contacting the gate structure; and
a corner structure along the first sidewall of the fin, wherein the corner structure is a different layer than the spacer, wherein the corner structure extends between the spacer and the gate structure along the first sidewall of the fin.

9. The semiconductor device of claim 8, wherein the gate structure comprises a gate dielectric layer, wherein a sidewall of the corner structure contacts the gate dielectric layer.

10. The semiconductor device of claim 8, wherein the corner structure comprises polysilicon or amorphous silicon.

11. The semiconductor device of claim 8, wherein a width of the corner structure measured parallel to the first sidewall of the fin is between 2 nm and 30 nm.

12. The semiconductor device of claim 8, wherein a thickness of the corner structure measured perpendicular to the first sidewall of the fin is between 2 nm and 20 nm.

13. The semiconductor device of claim 8, wherein the dielectric layer extends further between the gate structure and the fin than the corner structure.

14. The semiconductor device of claim 13, wherein the dielectric layer extends closer to the source/drain region than the corner structure.

15. A semiconductor device, comprising:
a fin extending from a substrate;
a gate stack over a top and along a sidewall of the fin, wherein the gate stack includes a conductive gate electrode;
an epitaxial source/drain region in the fin and adjacent to the gate stack;
a spacer along a first sidewall of the gate stack and the sidewall of the fin;
a corner structure positioned in a corner region of the sidewall of the fin and the gate stack, wherein the corner structure and the spacer are different layers, wherein the corner structure contacts the gate stack; and
a dielectric layer adjacent to the gate stack and separating the spacer and the corner structure from the sidewall of the fin.

16. The semiconductor device of claim 15, wherein the dielectric layer contacts the epitaxial source/drain region.

17. The semiconductor device of claim 15, wherein the corner structure has a triangular shape in a top-down view.

18. The semiconductor device of claim 15, wherein the corner structure comprises polysilicon or amorphous silicon.

19. The semiconductor device of claim 15, wherein the corner structure is between the gate stack and the fin along a line perpendicular to the sidewall of the fin in a top-down view.

20. The semiconductor device of claim 15, wherein the gate stack comprises a gate dielectric layer, wherein the corner structure contacts the gate dielectric layer and the spacer.

* * * * *